US012575256B2

(12) United States Patent
Kim et al.

(10) Patent No.: US 12,575,256 B2
(45) Date of Patent: Mar. 10, 2026

(54) DISPLAY DEVICE WITH A SELECTIVELY MODIFIED SURFACE AREA AND METHOD OF MANUFACTURING THE SAME

(71) Applicant: Samsung Display Co., LTD., Yongin-si (KR)

(72) Inventors: Jong Woo Kim, Hwaseong-si (KR); So Young Oh, Hwaseong-si (KR); Jong Kwang Yun, Seoul (KR); Woo Suk Jung, Yongin-si (KR); Jae Heung Ha, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 539 days.

(21) Appl. No.: 17/871,726

(22) Filed: Jul. 22, 2022

(65) Prior Publication Data

US 2023/0200112 A1     Jun. 22, 2023

(30) Foreign Application Priority Data

Dec. 21, 2021     (KR) ........................ 10-2021-0183928

(51) Int. Cl.
| | |
|---|---|
| *H10K 50/844* | (2023.01) |
| *H10K 59/12* | (2023.01) |
| *H10K 59/122* | (2023.01) |
| *H10K 59/80* | (2023.01) |
| *H10K 71/00* | (2023.01) |

(52) U.S. Cl.
CPC ....... *H10K 50/844* (2023.02); *H10K 59/8722* (2023.02); *H10K 59/879* (2023.02); *H10K 71/00* (2023.02); *H10K 59/1201* (2023.02); *H10K 59/122* (2023.02)

(58) Field of Classification Search
CPC .............. H10K 50/844; H10K 50/858; H10K 50/8426; H10K 71/00; H10K 59/1201; H10K 59/122
USPC ............................................... 257/40, 59, 98
See application file for complete search history.

(56) References Cited

U.S. PATENT DOCUMENTS

| | | |
|---|---|---|
| 8,188,509 B2 | 5/2012 | Lee |
| 8,357,929 B2 * | 1/2013 | Ryu ................... H10K 59/8723 |
| | | 257/40 |

(Continued)

FOREIGN PATENT DOCUMENTS

| | | |
|---|---|---|
| KR | 1020070064293 | 6/2007 |
| KR | 20140128595 A | 11/2014 |
| KR | 20190081724 A | 7/2019 |

*Primary Examiner* — Eric W Jones
(74) *Attorney, Agent, or Firm* — CANTOR COLBURN LLP

(57) ABSTRACT

A display device includes a first substrate including a first surface; a second substrate disposed to face and be spaced apart from the first surface of the first substrate; a display element layer disposed on the first surface of the first substrate to be spaced apart from the second substrate; a filling member interposed in a space between the first substrate and the second substrate; and a frit member which connects edge portions of the first substrate and the second substrate to each other, in which the second substrate includes a second surface facing the first surface of the first substrate, a surface modification area is defined on the second surface of the second substrate, and the surface modification area has hydrophobicity higher than hydrophobicity of the filling member.

21 Claims, 22 Drawing Sheets

300: HPA

(56)     References Cited

U.S. PATENT DOCUMENTS

| | | | |
|---|---|---|---|
| 8,710,492 B2* | 4/2014 | Niboshi | H10K 50/844 |
| | | | 438/26 |
| 9,066,386 B2 | 6/2015 | Han | |
| 10,290,828 B2 | 5/2019 | Li et al. | |
| 2015/0048330 A1* | 2/2015 | Kang | H10K 71/00 |
| | | | 257/40 |
| 2015/0250032 A1* | 9/2015 | Han | H05B 33/04 |
| | | | 313/504 |
| 2016/0254485 A1* | 9/2016 | Song | H10K 59/8722 |
| | | | 257/40 |
| 2017/0170247 A1* | 6/2017 | Kim | H10K 59/8723 |
| 2020/0075887 A1* | 3/2020 | Kim | H10K 50/81 |
| 2020/0348546 A1* | 11/2020 | Chen | G02F 1/1679 |

* cited by examiner

【Fig. 1】
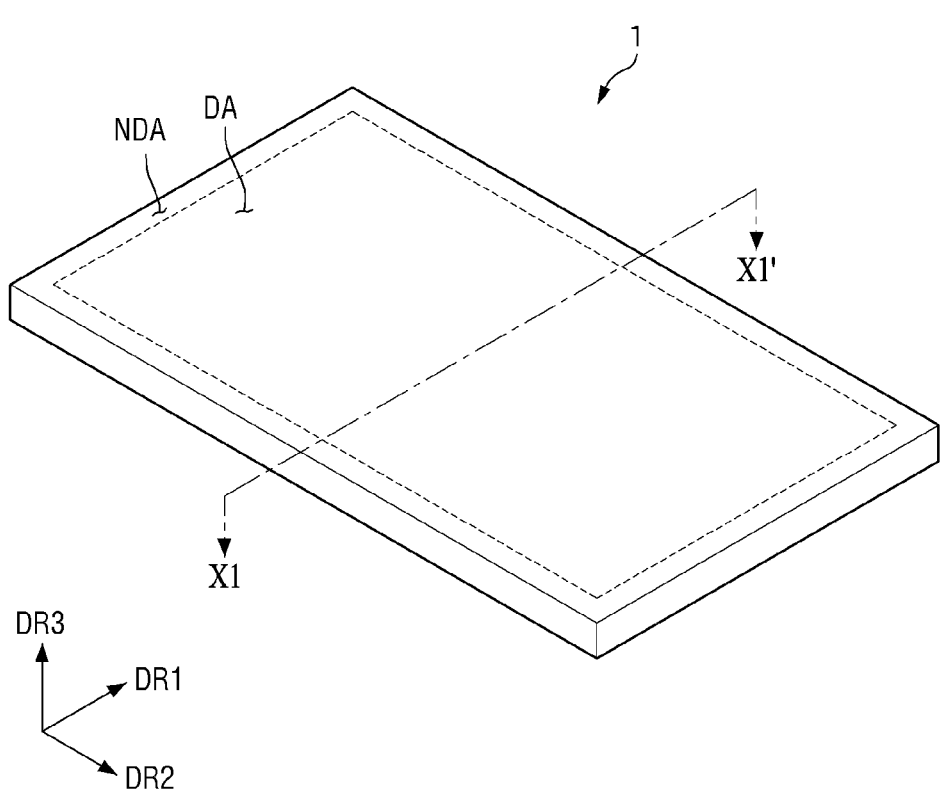

【Fig. 2】
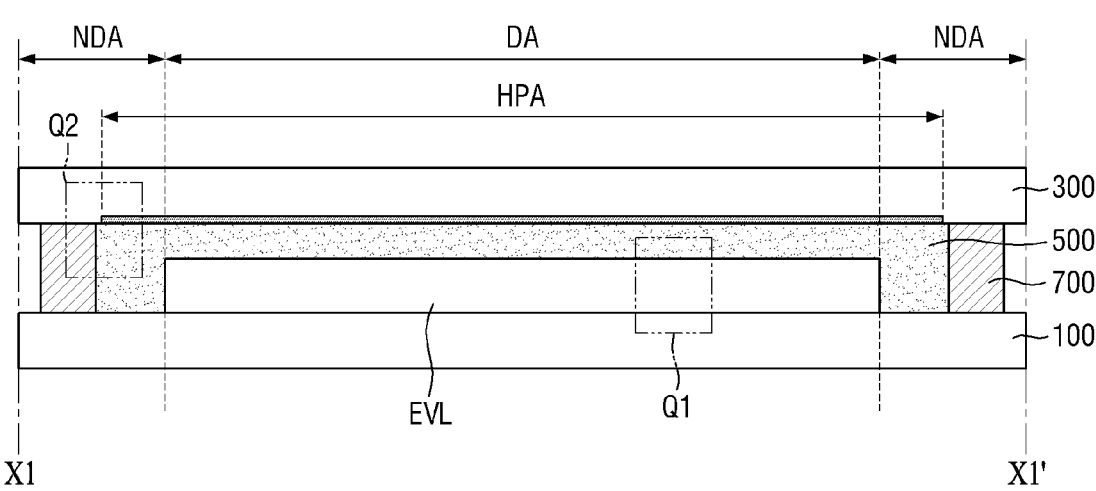
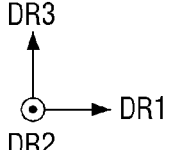
300: HPA

【Fig. 3】
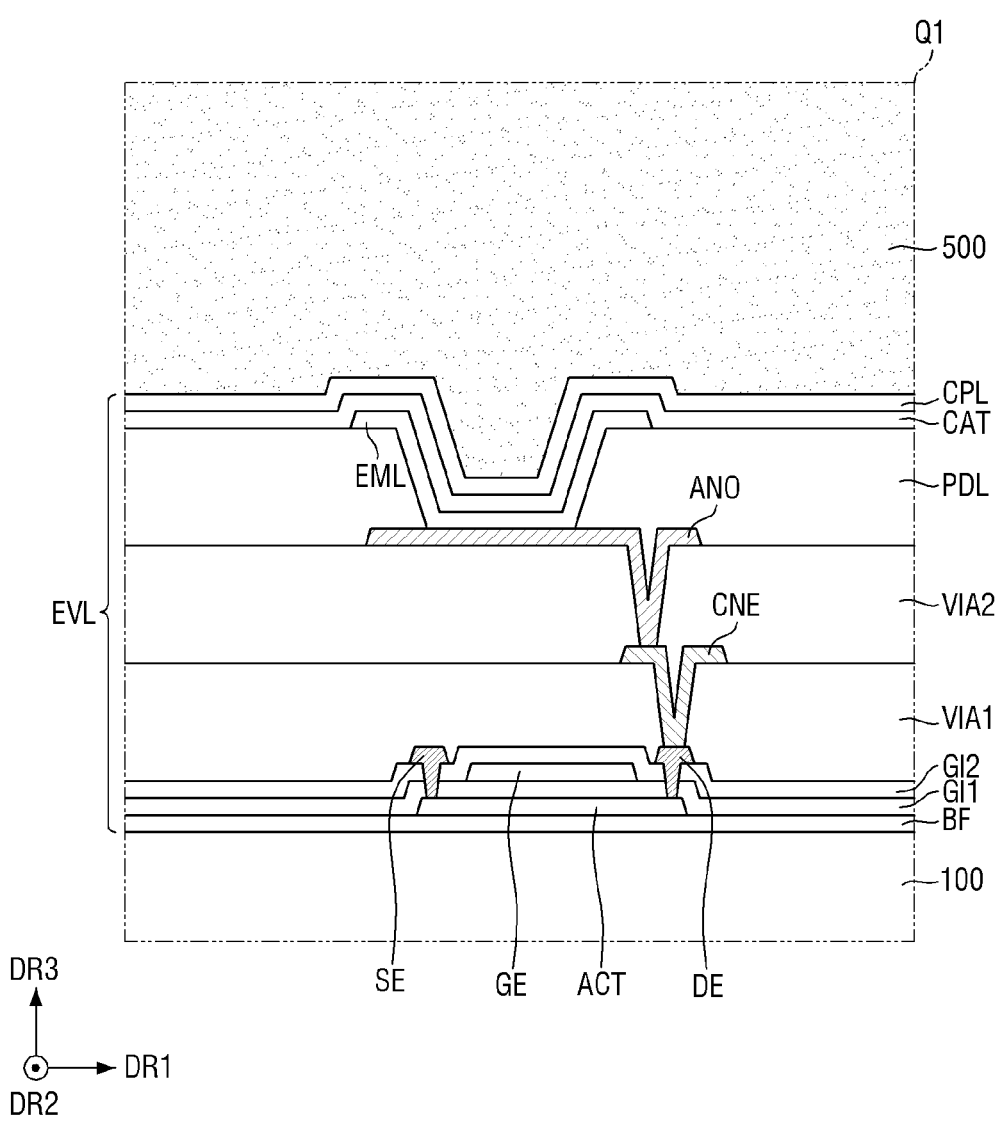

【Fig. 4】
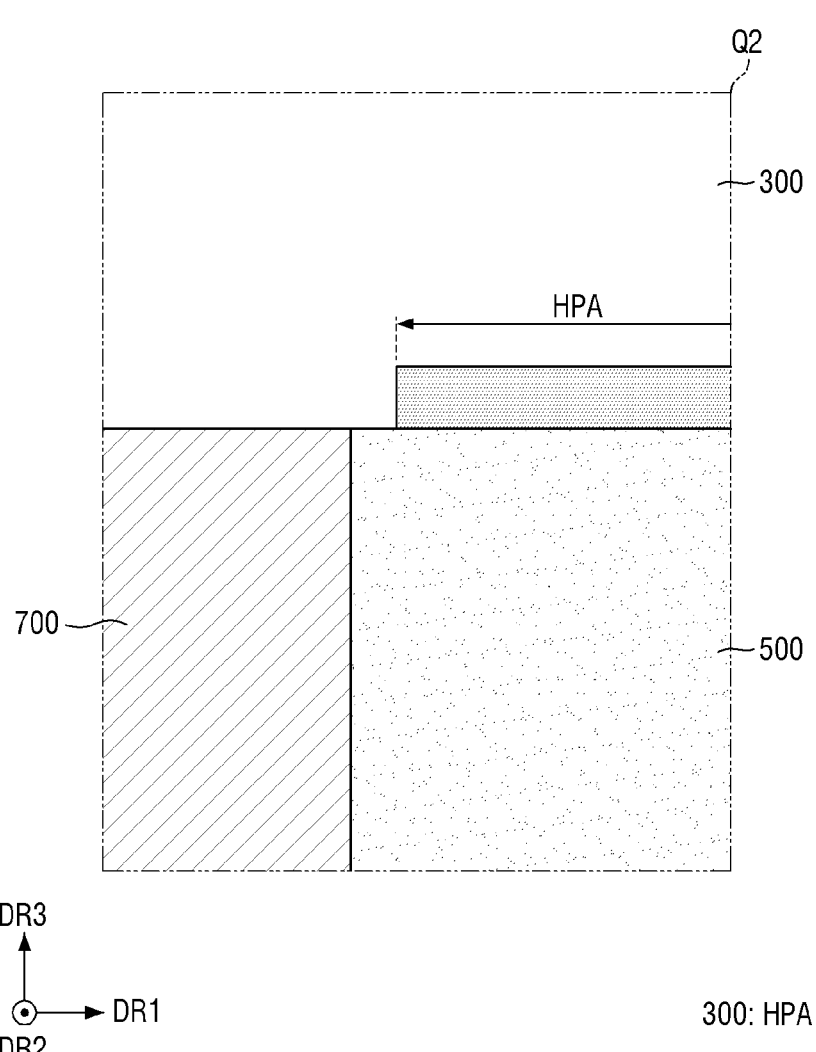
300: HPA

【Fig. 5】
300
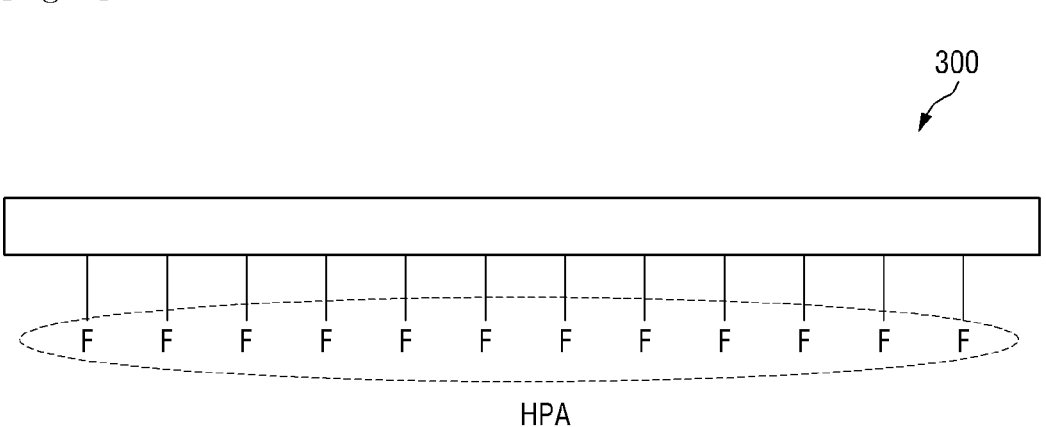
HPA

【Fig. 6】

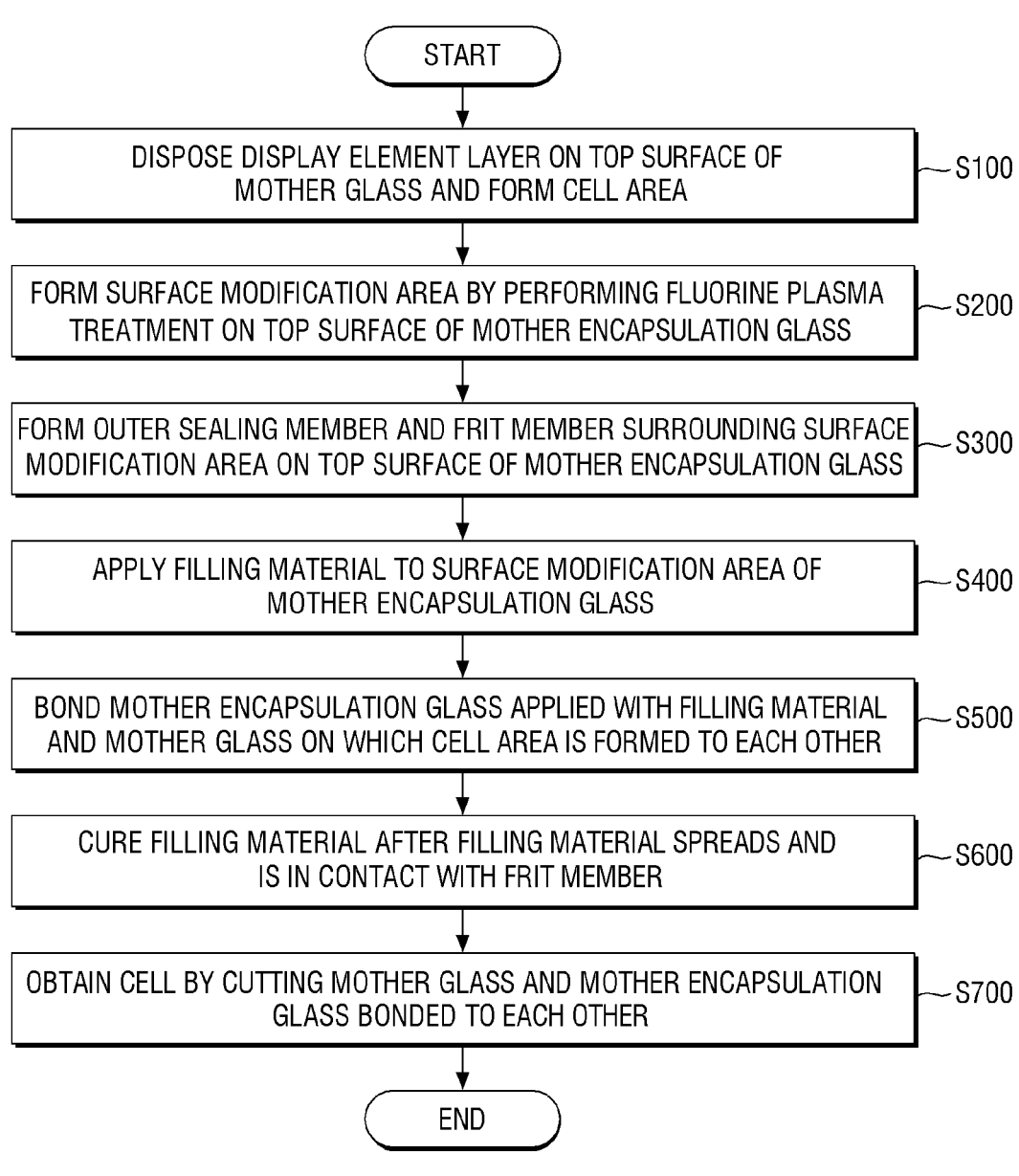

START

DISPOSE DISPLAY ELEMENT LAYER ON TOP SURFACE OF
MOTHER GLASS AND FORM CELL AREA — S100

FORM SURFACE MODIFICATION AREA BY PERFORMING FLUORINE PLASMA
TREATMENT ON TOP SURFACE OF MOTHER ENCAPSULATION GLASS — S200

FORM OUTER SEALING MEMBER AND FRIT MEMBER SURROUNDING SURFACE
MODIFICATION AREA ON TOP SURFACE OF MOTHER ENCAPSULATION GLASS — S300

APPLY FILLING MATERIAL TO SURFACE MODIFICATION AREA OF
MOTHER ENCAPSULATION GLASS — S400

BOND MOTHER ENCAPSULATION GLASS APPLIED WITH FILLING MATERIAL
AND MOTHER GLASS ON WHICH CELL AREA IS FORMED TO EACH OTHER — S500

CURE FILLING MATERIAL AFTER FILLING MATERIAL SPREADS AND
IS IN CONTACT WITH FRIT MEMBER — S600

OBTAIN CELL BY CUTTING MOTHER GLASS AND MOTHER ENCAPSULATION
GLASS BONDED TO EACH OTHER — S700

END

【Fig. 7】
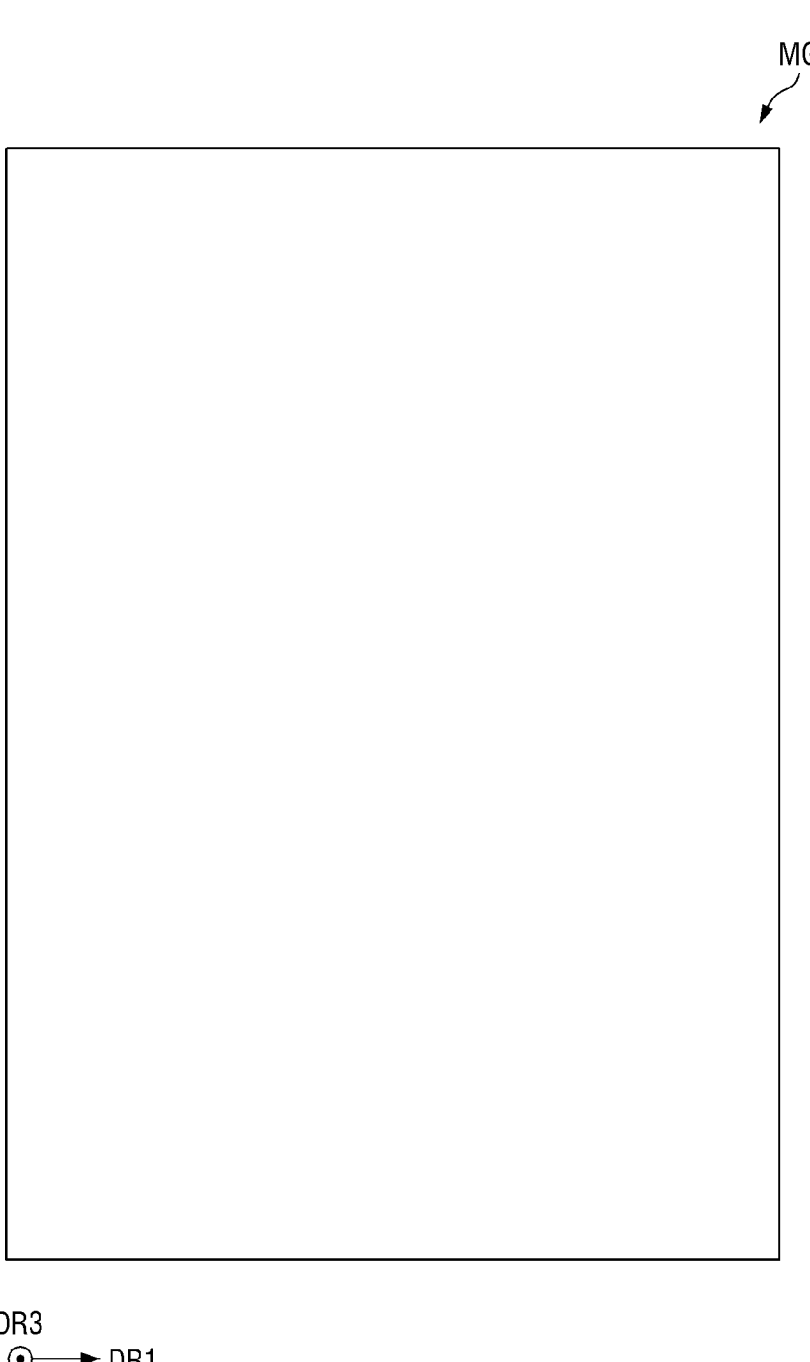

【Fig. 8】
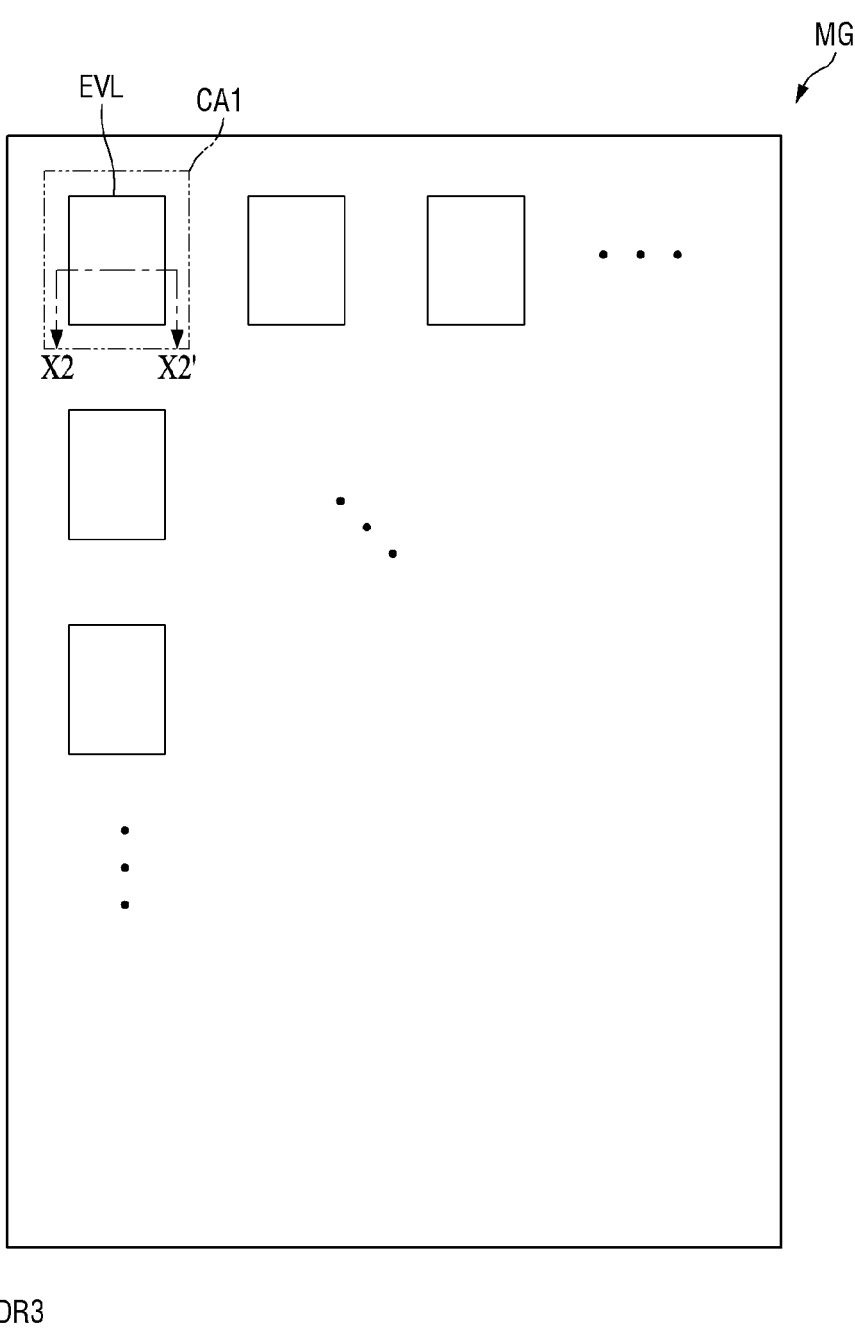

【Fig. 9】
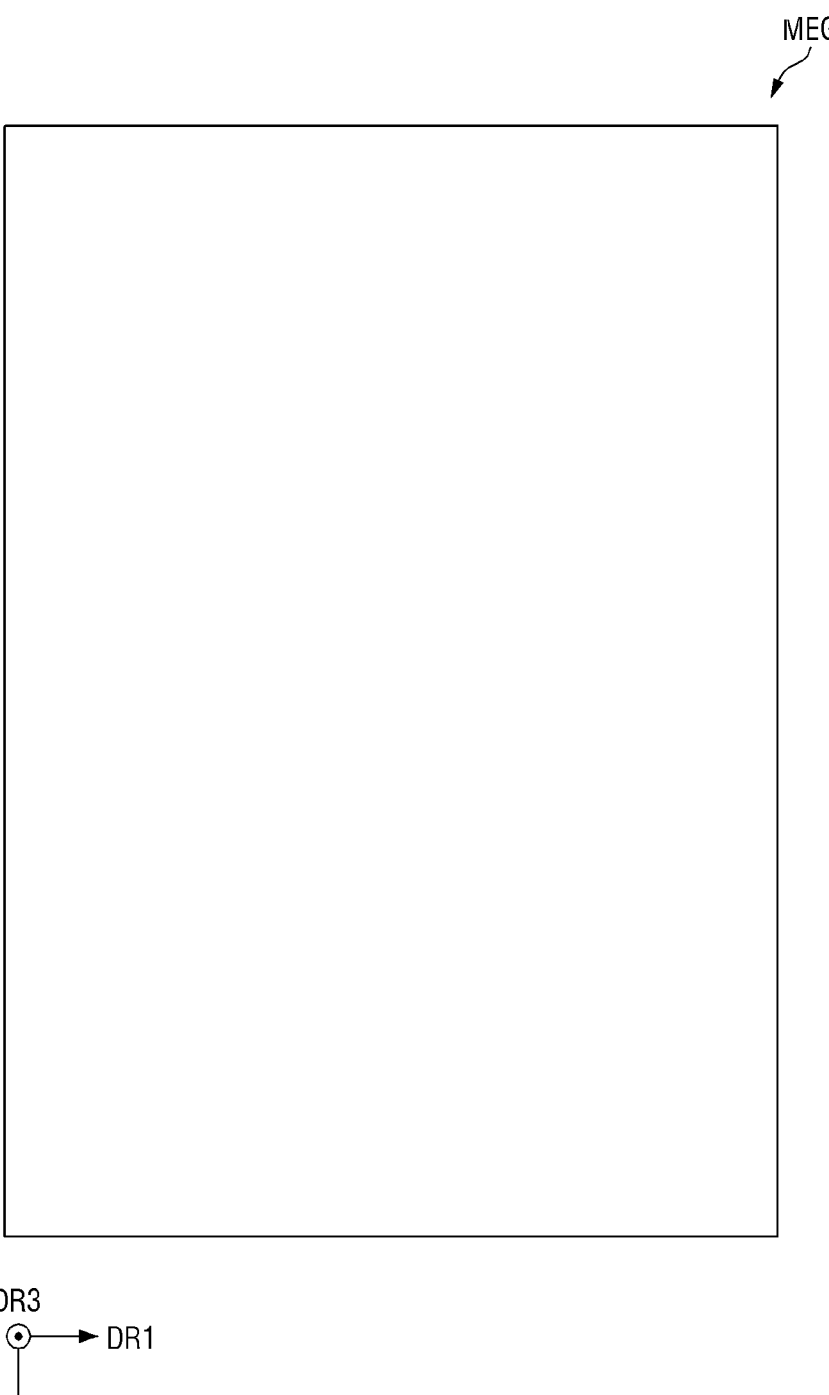
MEG
DR3
DR1
DR2

【Fig. 10】
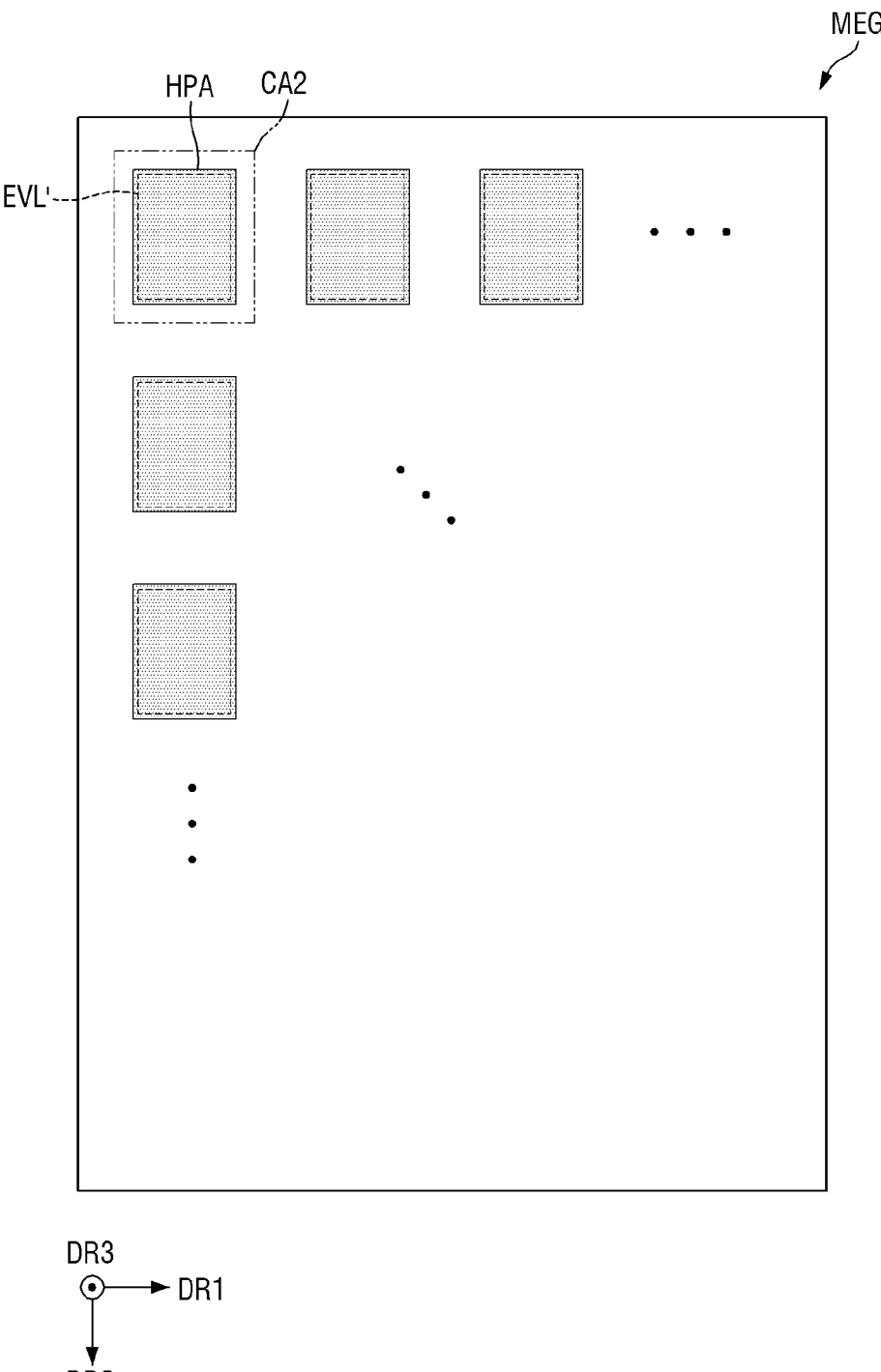

【Fig. 11】
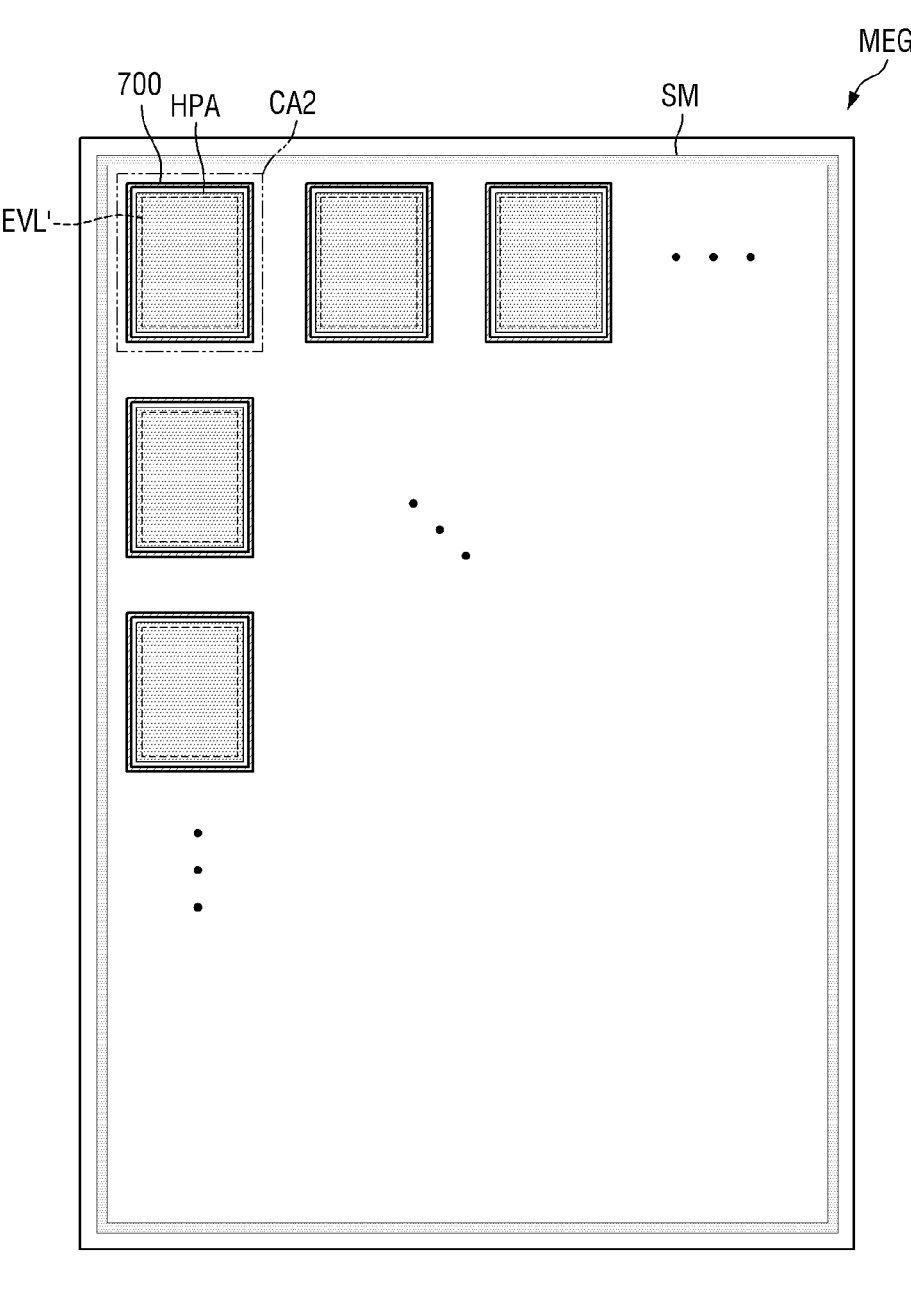
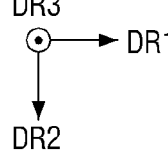

【Fig. 12】
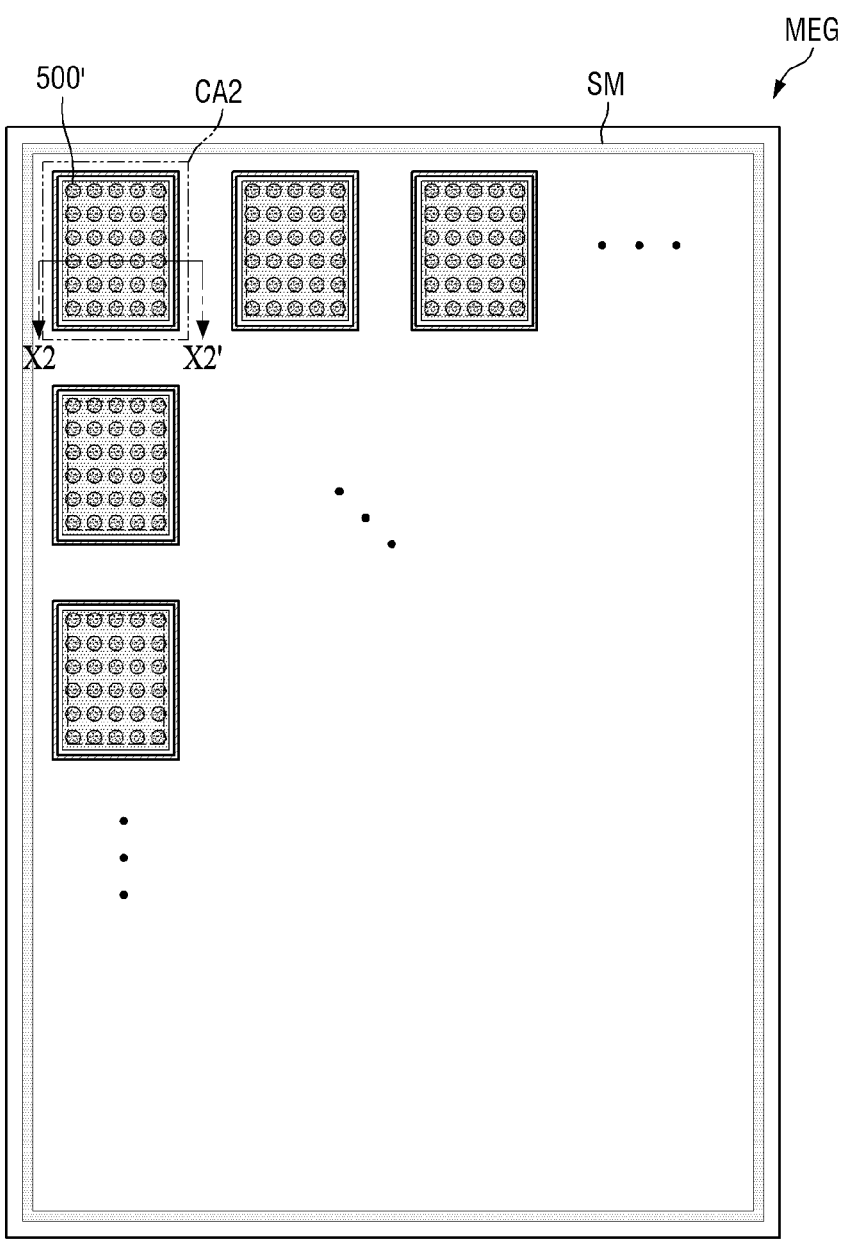
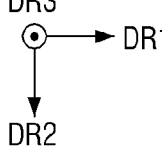

【Fig. 13】
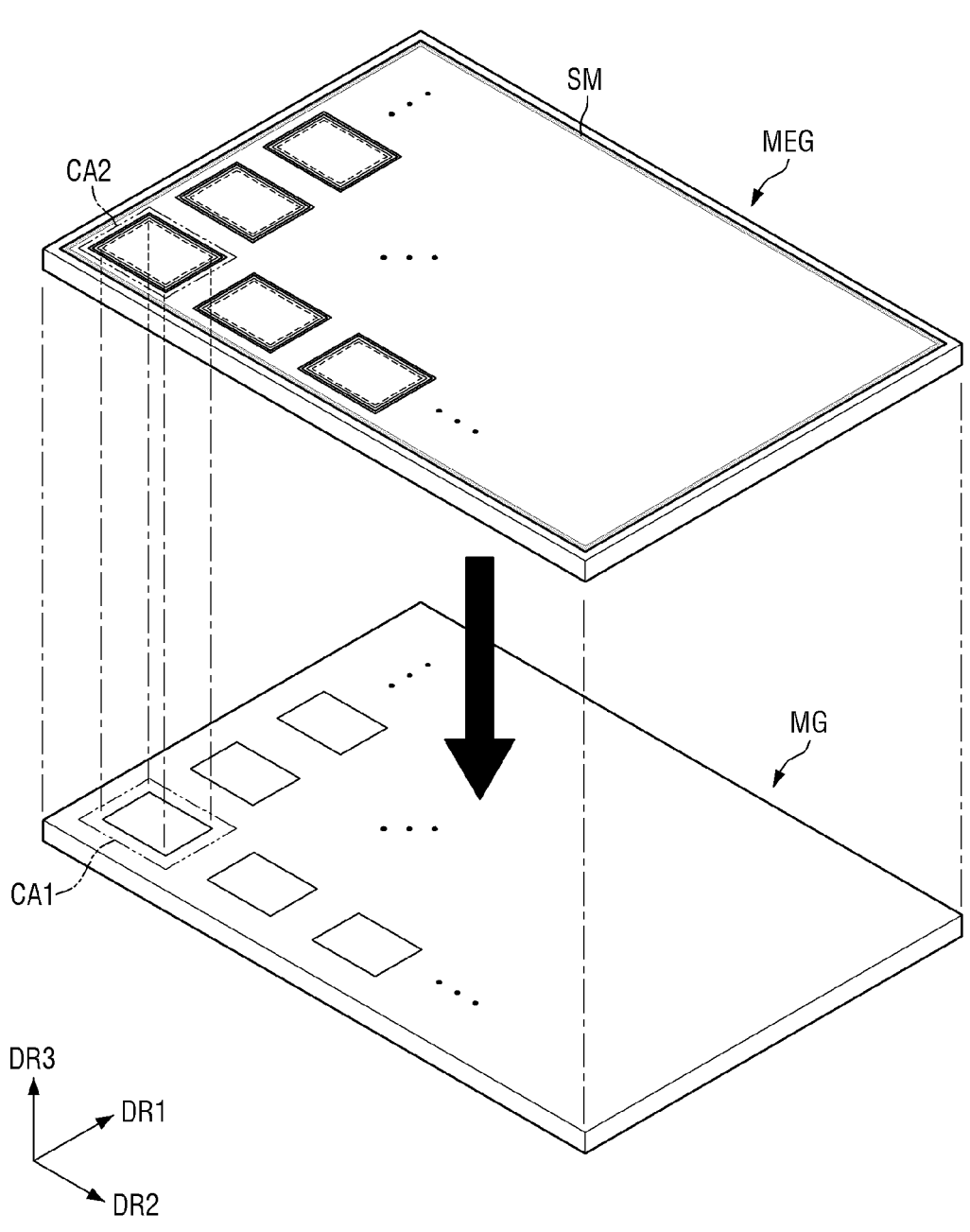

【Fig. 14】
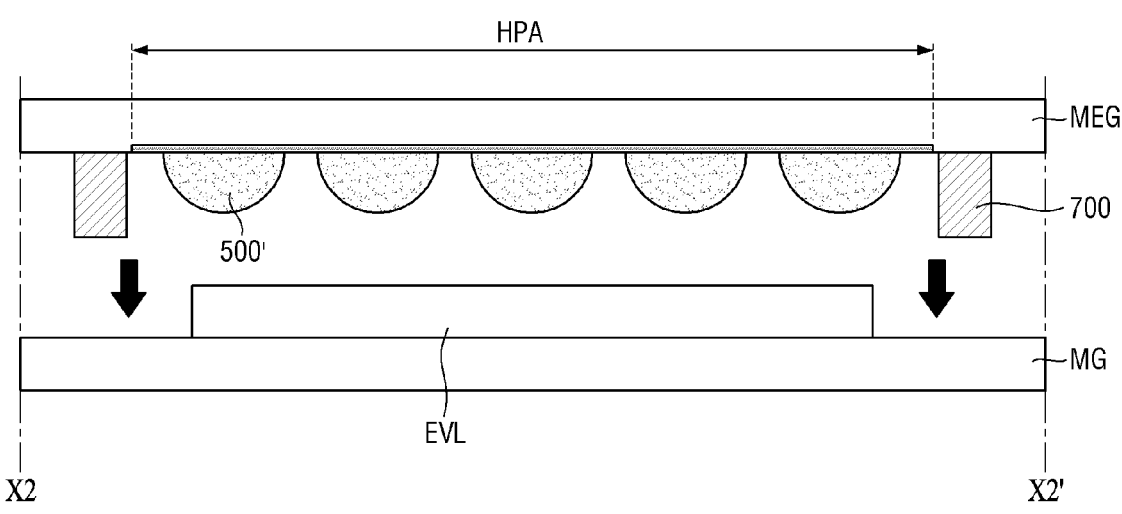
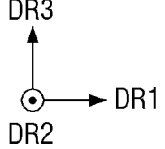
300: HPA

【Fig. 15】
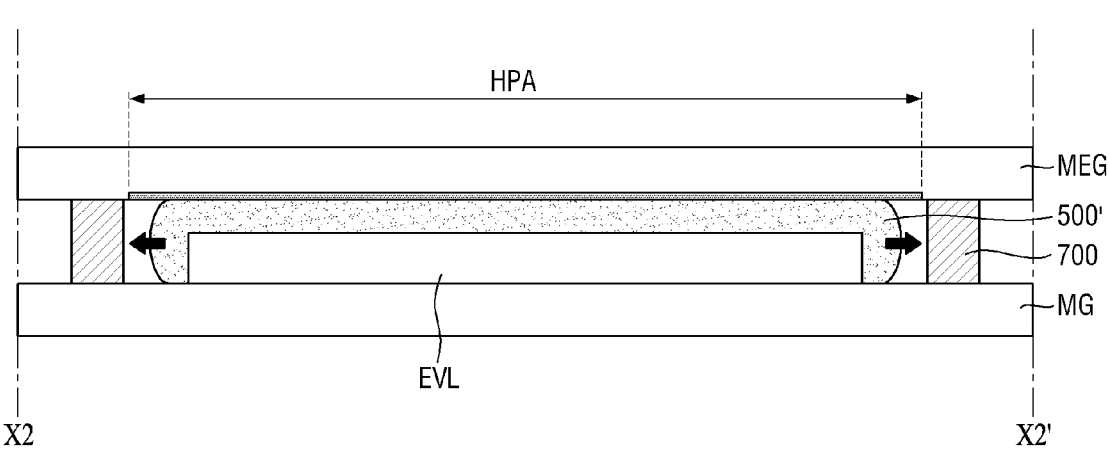
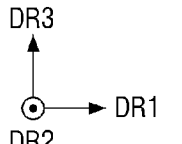
300: HPA

【Fig. 16】
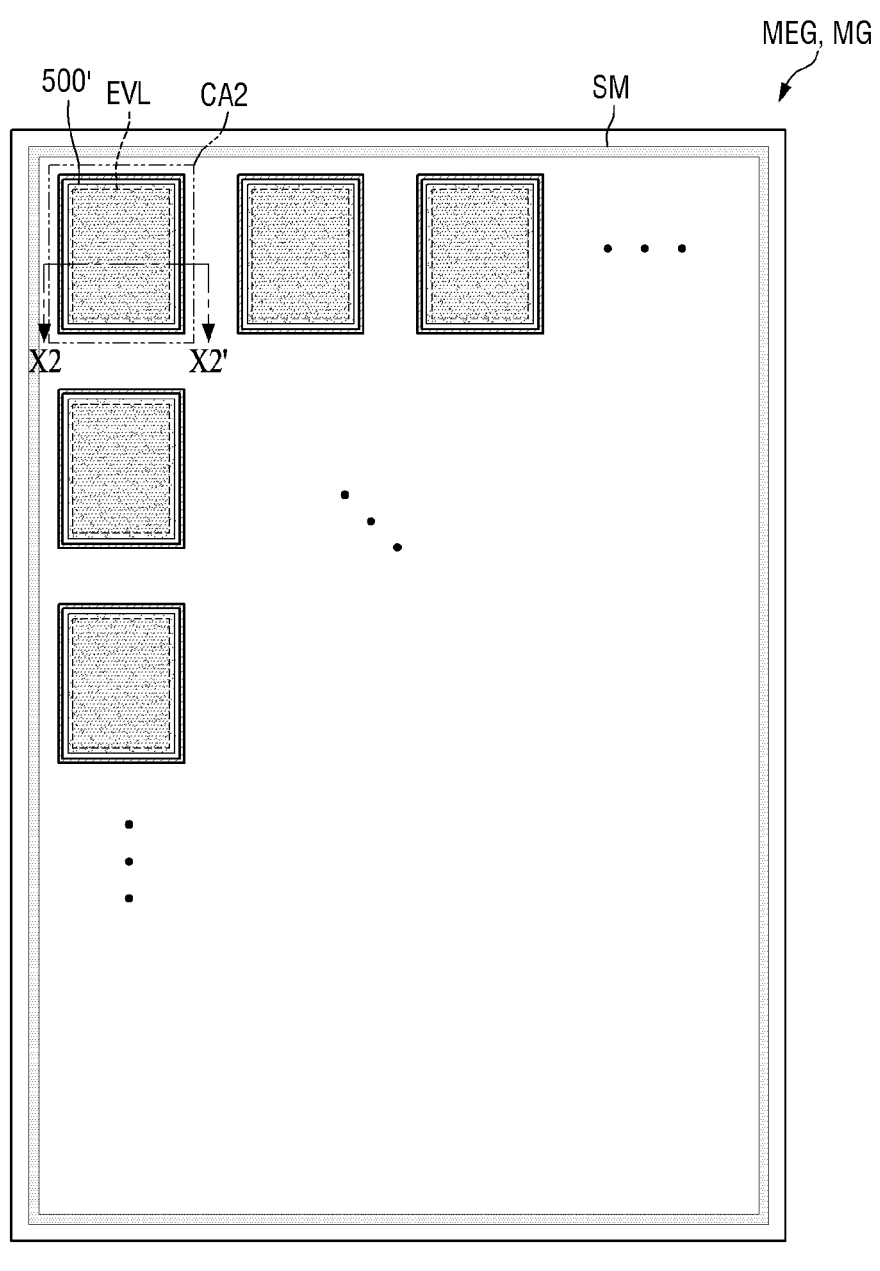
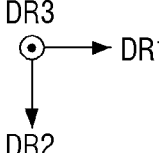

【Fig. 17】
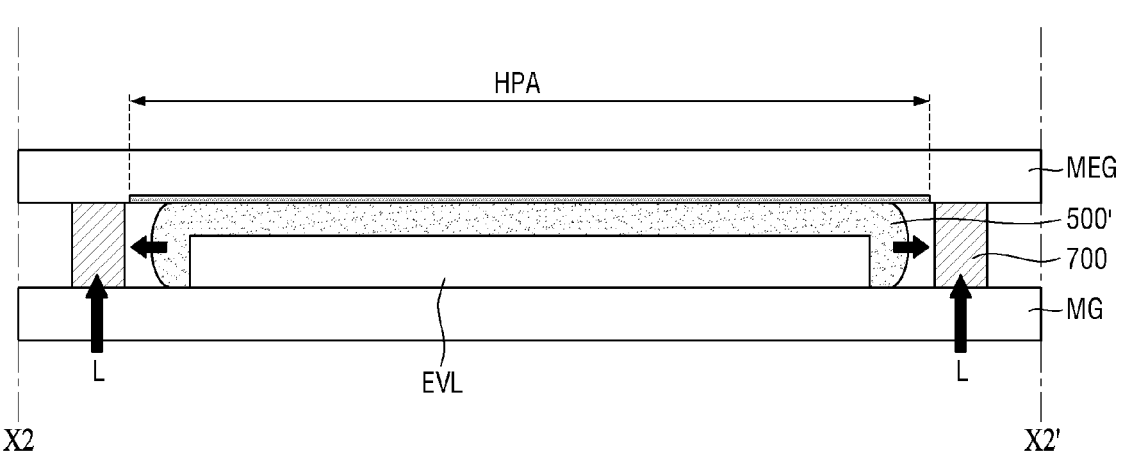
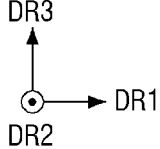
300: HPA

【Fig. 18】
MEG, MG
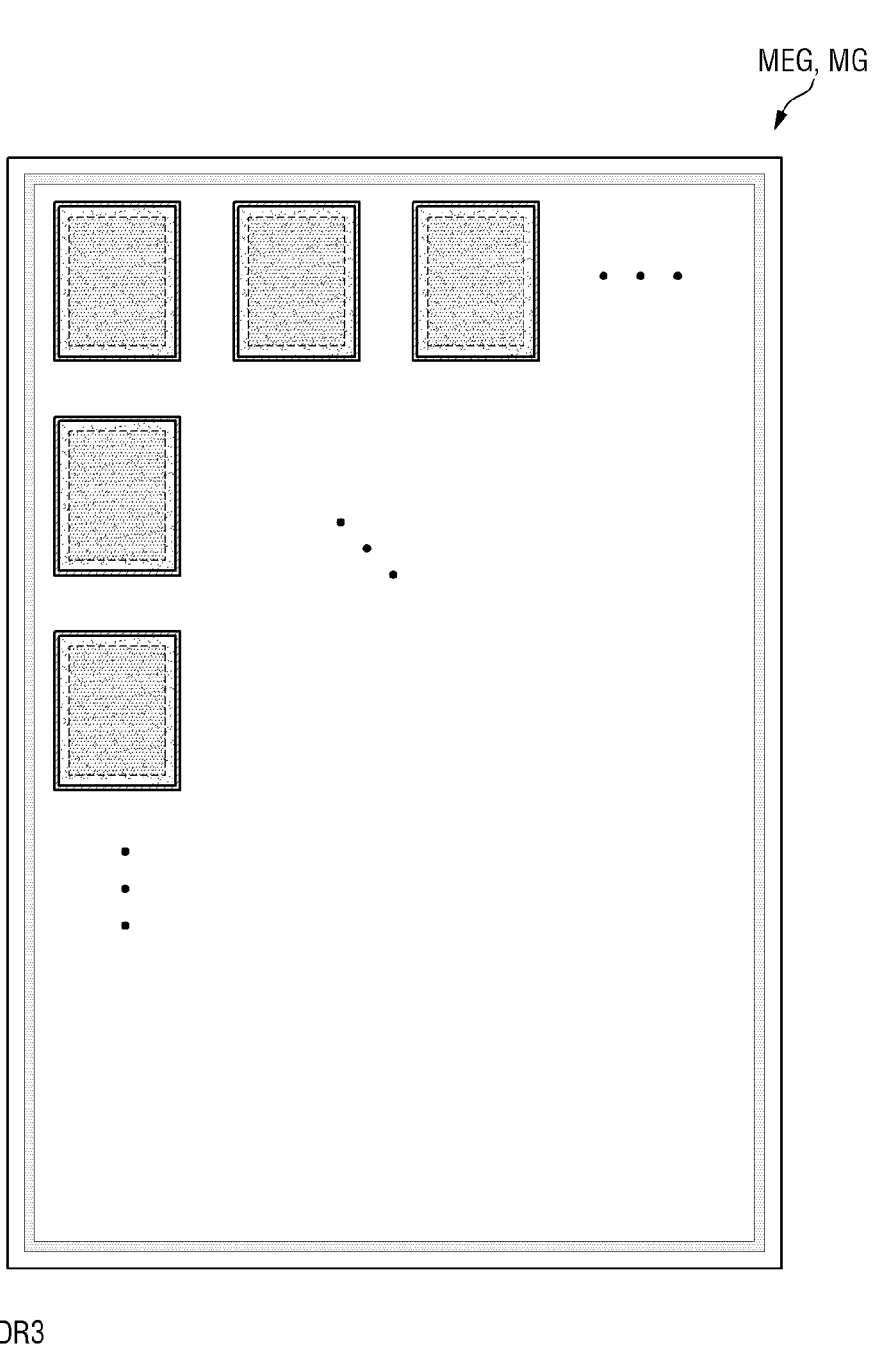
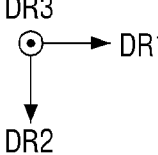

【Fig. 19】
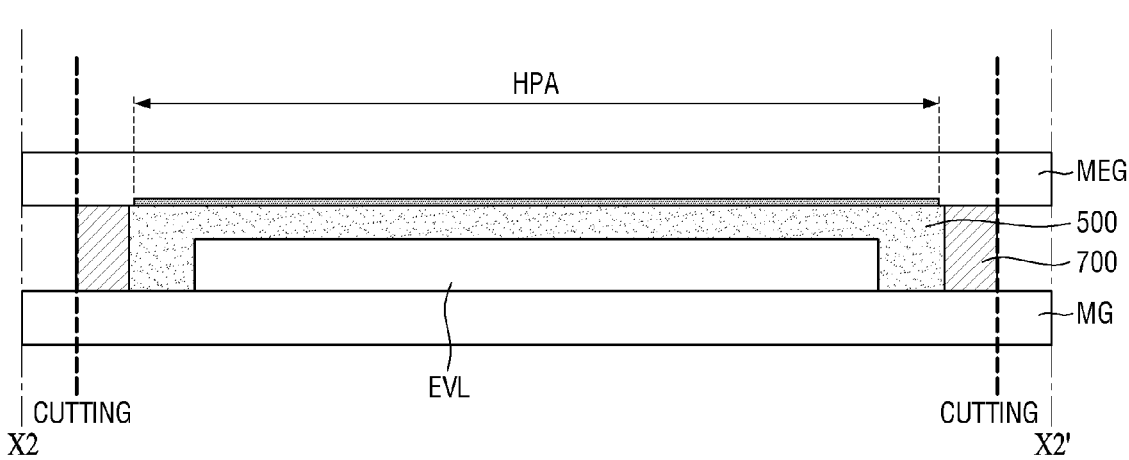
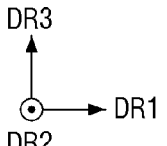
300: HPA

【Fig. 20】
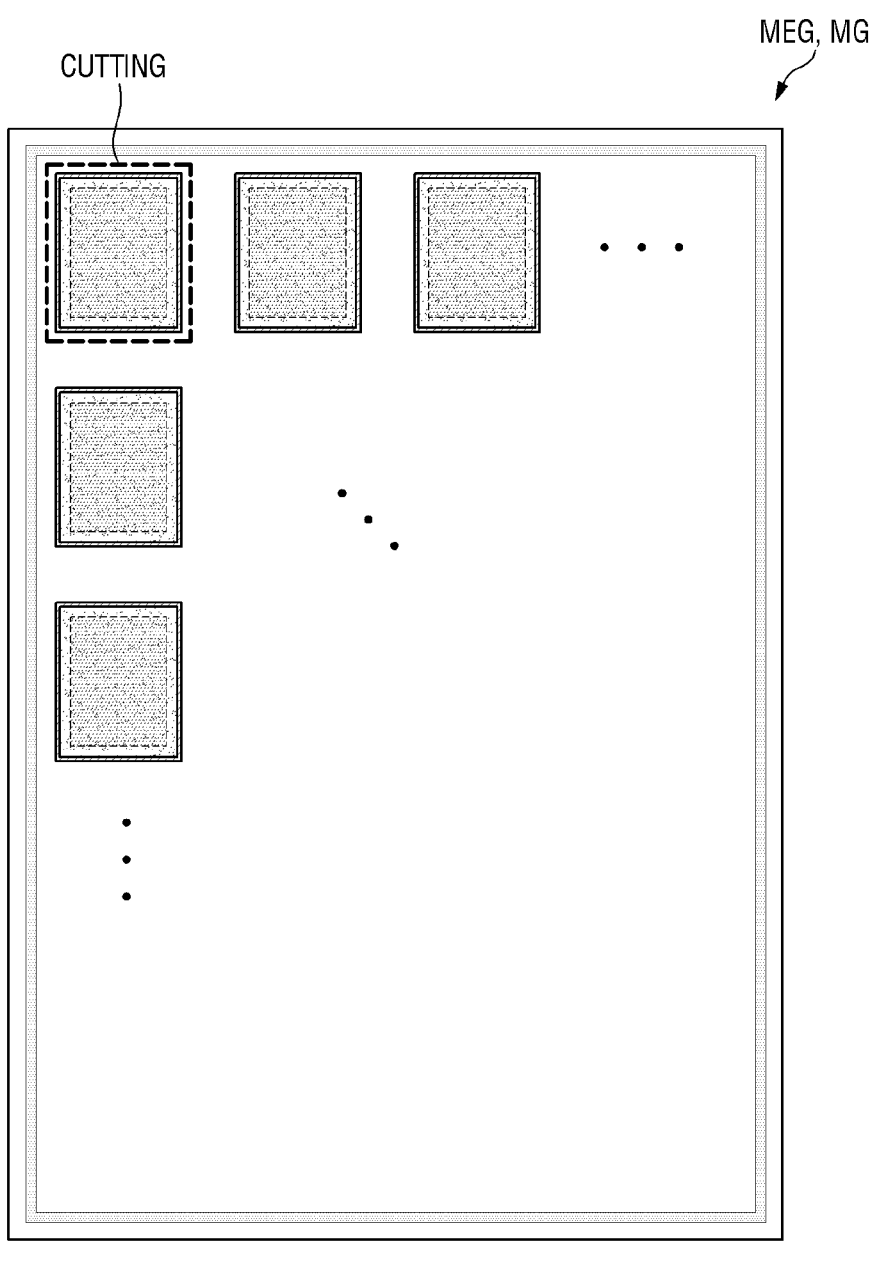
CUTTING
MEG, MG
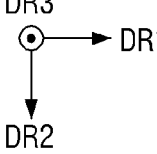
DR3
DR1
DR2

【Fig. 21】
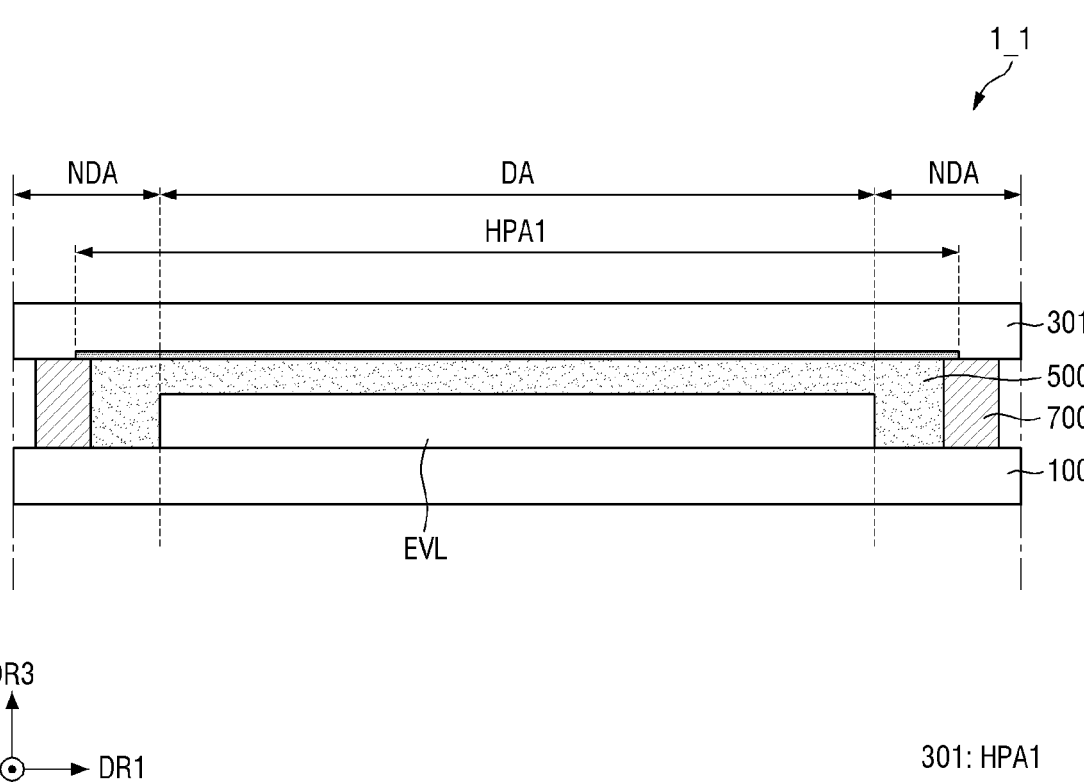
DR3
DR2  DR1
301: HPA1

【Fig. 22】
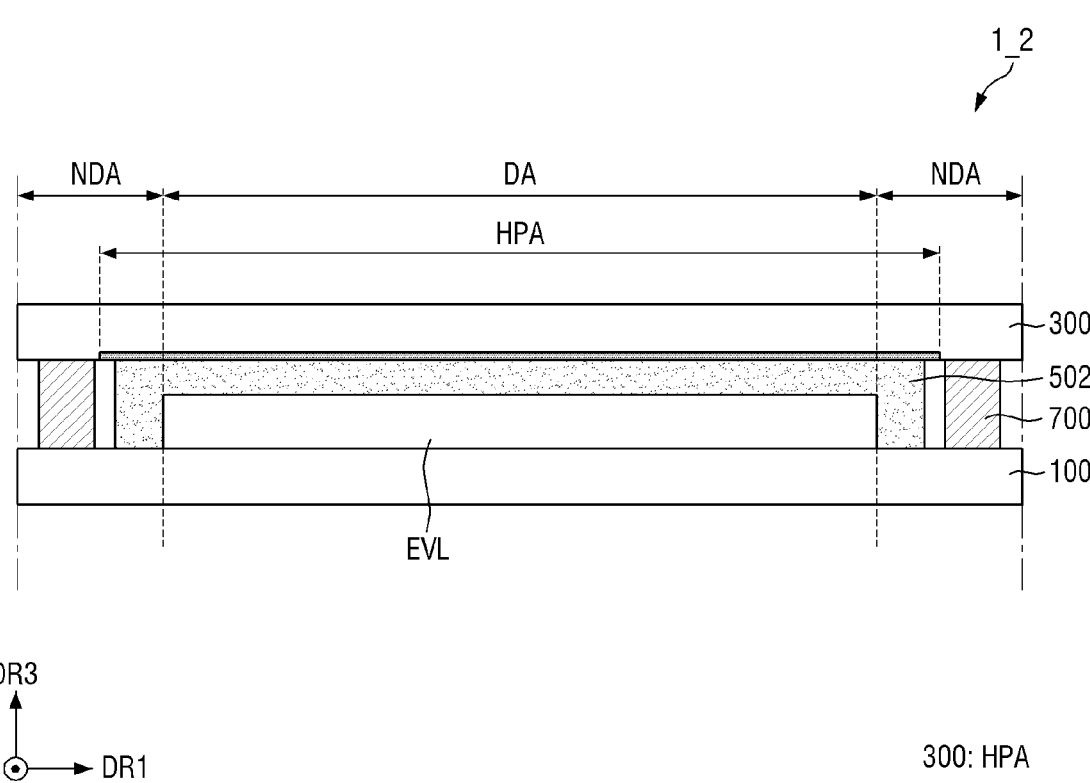
300: HPA

DISPLAY DEVICE WITH A SELECTIVELY MODIFIED SURFACE AREA AND METHOD OF MANUFACTURING THE SAME

This application claims priority to Korean Patent Application No. 10-2021-0183928, filed on Dec. 21, 2021, and all the benefits accruing therefrom under 35 U.S.C. 119, the content of which in its entirety is herein incorporated by reference.

BACKGROUND

1. Field

The disclosure relates to a display device and a method of manufacturing the display device.

2. Description of the Related Art

The importance of display devices is gradually increasing with the development of multimedia. In response to the importance of the display device, various display devices such as a liquid crystal display device (LCD) and an organic light emitting diode display device (OLED) have been developed.

Among the display devices, a self-light emitting display device includes a self-light emitting element, for example, an organic light emitting element. The self-light emitting element may include two opposing electrodes and an emission layer interposed therebetween. In a self-light emitting display device, where the self-light emitting element is the organic light emitting element, electrons and holes provided from the two electrodes may recombine in the emission layer to generate excitons, the generated excitons may change from an excited state to a ground state, and light may be emitted.

The self-light emitting display device, which does not include a light source, such as a backlight unit, has low power consumption and may be configured in a lightweight and thin shape, and has also attracted attention as a next-generation display device because of its high-quality characteristics such as a wide viewing angle, high luminance and contrast, and a fast response speed.

SUMMARY

Embodiments of the disclosure provide a display device having improved screen visibility and improved mechanical strength without affecting an element therein.

Embodiments of the disclosure provide a method of manufacturing a display device having improved screen visibility and improved mechanical strength without affecting an element in the display device.

According to an embodiment of the disclosure, a display device includes, a first substrate including a first surface; a second substrate disposed to face and be spaced apart from the first surface of the first substrate; a display element layer disposed on the first surface of the first substrate to be spaced apart from the second substrate; a filling member interposed in a space between the first substrate and the second substrate; and a frit member which connects edges of the first substrate and the second substrate to each other, where the second substrate includes a second surface facing the first surface of the first substrate, a surface modification area is defined on the second surface of the second substrate, and the surface modification area has hydrophobicity higher than hydrophobicity of the filling member.

In an embodiment, the surface modification area may completely cover the display element layer.

In an embodiment, the surface modification area of the second surface may be defined by an area of the second surface which is surface-modified with fluorine atoms.

In an embodiment, the first substrate and the second substrate may include glass.

In an embodiment, the filling member may be in direct contact with the display element layer and the surface modification area of the second substrate.

In an embodiment, the filling member may include at least one selected from an acrylate-based resin including silicon, an epoxy-based resin including silicon, a vinyl-based resin including silicon, and a phenyl-based resin including silicon.

In an embodiment, the filling member may have a refractive index of about 1.4 or greater and about 1.5 or less.

In an embodiment, the filling member may include a platinum catalyst, and the content of the platinum catalyst in the filling member is about 0.1% or greater and about 0.3% or less.

In an embodiment, the frit member may surround the surface modification area and may not overlap the surface modification area.

In an embodiment, the frit member may be disposed to be spaced apart from the display element layer, and the filling member completely may cover the display element layer.

In an embodiment, the filling member may be in direct contact with the frit member.

In an embodiment, the filling member completely may fill the space between the first substrate and the second substrate.

According to an embodiment of the disclosure, a method of manufacturing a display device, the method comprises, preparing a first substrate on which a display element layer is disposed on one surface; preparing a second substrate; forming a surface modification area by performing hydrophobic treatment on one surface of the second substrate; disposing a frit member surrounding the surface modification area on the one surface of the second substrate; applying a filling member on the surface modification area of the second substrate after the disposing the frit member; and bonding the first substrate and the second substrate to each other in a way such that the one surface of the first substrate and the one surface of the second substrate face each other.

In an embodiment, the forming the surface modification area by performing the hydrophobic treatment on the one surface of the second substrate may include performing the hydrophobic treatment by a fluorine plasma treatment process.

In an embodiment, the filling member may have hydrophobicity lower than hydrophobicity of the surface modification area.

In an embodiment, the applying the filling member on the surface modification area of the second substrate may include applying the filling member in the form of a dot.

In an embodiment, the filling member may be not in contact with the frit member when the filling member is applied on the surface modification area of the second substrate.

In an embodiment, the method of manufacturing a display device may further include, after the bonding the first substrate and the second substrate to each other, irradiating the frit member with a laser beam.

In an embodiment, the method of manufacturing a display device may further include, after the irradiating the frit member with the laser beam, spreading the filling member to be in contact with the frit member.

In an embodiment, the method of manufacturing a display device may further include, after the spreading the filling member to be in contact with the frit member, curing the filling member.

BRIEF DESCRIPTION OF THE DRAWINGS

The above and other features of the disclosure will become more apparent by describing in detail embodiments thereof with reference to the attached drawings, in which:

FIG. 1 is a perspective view schematically illustrating a display device according to an embodiment;

FIG. 2 is a cross-sectional view schematically illustrating a cross section taken along line X1-X1' of FIG. 1;

FIG. 3 is an enlarged view of area Q1 of FIG. 2;

FIG. 4 is an enlarged view of area Q2 of FIG. 2;

FIG. 5 is a structural view schematically illustrating a structure of a surface modification area of an encapsulation substrate;

FIGS. 6 to 20 are views for describing a method of manufacturing a display device according to an embodiment;

FIG. 21 is a structural view schematically illustrating a structure of a display device according to an alternative embodiment; and FIG. 22 is a structural view schematically illustrating a structure of a display device according to another alternative embodiment.

DETAILED DESCRIPTION

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a perspective view schematically illustrating a display device according to an embodiment.

Referring to FIG. 1, an embodiment of a display device 1 may be applied to portable electronic devices such as mobile phones, smartphones, tablet personal computers (PCs), mobile communication terminals, electronic notebooks, electronic books, portable multimedia players (PMPs), navigation devices, and ultra mobile PCs (UMPCs). Alternatively, the display device 1 may be applied as a display unit of televisions, laptop computers, monitors, billboards, or the Internet of Things (IoT). These are presented only as examples, and may also be employed in other electronic devices without departing from the concept of the disclosure.

The display device 1 has a three-dimensional shape. In an embodiment, for example, the display device 1 may have a rectangular parallelepiped shape or a three-dimensional shape similar thereto. In the drawings, a first direction DR1 refers to a direction parallel to a first side of the display device 1, a second direction DR2 refers to a direction parallel to a second side of the display device 1, and a third direction DR3 refers to a thickness direction of the display device 1. In the following specification, unless otherwise specified, the term "direction" may refer to both directions toward both sides extending along the direction. In addition, when both "directions" extending to both sides need to be distinguished from each other, one side will be referred to as "one side in the direction" and the other side will be referred to as "the other side in the direction". In FIG. 1, an arrow direction will be referred to as one side, and an opposite direction to the arrow direction will be referred to as the other side. The first direction DR1 and the second direction DR2 may be perpendicular to each other, the first direction DR1 and the third direction DR3 may be perpendicular to each other, and the second direction DR2 and the third direction DR3 may be perpendicular to each other. Here, the third direction DR3 may be a thickness direction of the display device 1.

In some embodiments, the display device 1 may have a planar shape similar to a quadrangle. In such embodiments, the display device 1 may have a planar shape similar to a quadrangle having a long side in the first direction DR1 and a short side in the second direction DR2 as illustrated in FIG. 1, but is not limited thereto. In an embodiment, for example, in the planar shape of the display device 1, a corner where the long side in the first direction DR1 and the short side in the second direction DR2 meet may be rounded to have a predetermined curvature, may be formed at a right angle, or may be formed similarly to other polygons, circles, or ovals without being limited to the quadrangle.

The display device 1 may include a display area DA in which a screen is displayed and a non-display area NDA in which a screen is not displayed. In some embodiments, the non-display area NDA may be disposed to surround an edge of the display area DA, but is not limited thereto. An image displayed in the display area DA may be viewed by a user from one side in the third direction DR3 with reference to FIG. 1.

Hereinafter, a structure of the display device 1 according to an embodiment will be described in detail.

FIG. 2 is a cross-sectional view schematically illustrating a cross section taken along line X1-X1' of FIG. 1. FIG. 3 is an enlarged view of area Q1 of FIG. 2. FIG. 4 is an enlarged view of area Q2 of FIG. 2. FIG. 5 is a structural view schematically illustrating a structure of a surface modification area HPA of an encapsulation substrate.

Referring to FIGS. 2 to 5, an embodiment of the display device 1 may include a first substrate 100, a display element layer EVL, a filling member 500, a second substrate 300, and a frit member 700.

The first substrate 100 may serve as a base of the display device 1. The first substrate 100 may include or be made of a rigid material having rigidity. In some embodiments, the first substrate 100 may include glass, but is not limited thereto. In an alternative embodiment, for example, the first substrate 100 may include quartz.

A display element layer EVL may be disposed on one side surface (hereinafter, referred to as a 'top surface') of the first substrate 100 in the third direction DR3. The display element layer EVL may serve to display a screen, thereby defining the display area DA of the display device 1. In such an embodiment, an area in which the display element layer EVL is disposed on the first substrate 100 may be the display area DA, and an area in which the display element layer EVL is not disposed on the first substrate 100 may be the non-display area NDA. In such an embodiment, the display element layer EVL may overlap the display area DA in the third direction DR3 and may not overlap the non-display area NDA in the third direction DR3.

In an embodiment, as illustrated in FIGS. 3, the display element layer EVL may include a buffer layer BF, a semiconductor layer ACT, a first gate insulating layer GI1, a gate electrode GE, a second gate insulating layer GI2, source/drain electrodes SE and DE, a first via insulating layer VIA1, a connection electrode CNE, a second via insulating layer VIA2, a light emitting element, a pixel defining layer PDL, and a capping layer CPL.

The buffer layer BF of the display element layer EVL may be disposed on the first substrate 100. The buffer layer BF may serve to prevent diffusion of metal atoms or impurities from the first substrate 100 to the semiconductor layer ACT on the buffer layer BF. In some embodiments, the buffer layer BF may include an inorganic insulating material.

The semiconductor layer ACT of the display element layer EVL may be disposed on the buffer layer BF. The semiconductor layer ACT may be in direct contact with one surface of the buffer layer BF. The semiconductor layer ACT may be selectively patterned and disposed on the buffer layer BF. Although not illustrated in the drawings, the semiconductor layer ACT may include a channel area overlapping the gate electrode GE in the third direction DR3, a drain area positioned at one side of the channel area, and a source area positioned at the other side of the channel area.

In some embodiments, the semiconductor layer ACT may include polycrystalline silicon, but is not limited thereto. In an embodiment, for example, the semiconductor layer ACT may include amorphous silicon or an oxide semiconductor.

The first gate insulating layer GI1 of the display element layer EVL may be disposed on the semiconductor layer ACT. The first gate insulating layer GI1 may serve to insulate the semiconductor layer ACT from the gate electrode GE. The first gate insulating layer GI1 may be disposed on the buffer layer BF on which the semiconductor layer ACT is disposed to cover the semiconductor layer ACT. The first gate insulating layer GI1 may be disposed to have substantially a constant thickness along a profile of the semiconductor layer ACT. In some embodiments, the first gate insulating layer GI1 may include an inorganic insulating material.

The gate electrode GE of the display element layer EVL may be disposed on the first gate insulating layer GI1. The gate electrode GE may be positioned directly on one surface of the first gate insulating layer GI1 to be in direct contact with the one surface of the first gate insulating layer GI1.

The gate electrode GE may include a metal. In an embodiment, for example, the gate electrode GE may include one or more metals (i.e., at least one metal) selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second gate insulating layer GI2 of the display element layer EVL may be disposed on the first gate insulating layer GI1 on which the gate electrode GE is disposed to cover the gate electrode GE. The second gate insulating layer GI2 may serve to insulate the gate electrode GE from the source/drain electrodes SE and DE. The second gate insulating layer GI2 may be disposed to have substantially the same thickness along profiles of the gate electrode GE and the first gate insulating layer. In some embodiments, the second gate insulating layer GI2 may include an inorganic insulating material and may be formed of a plurality of layers, but is not limited thereto.

The source/drain electrodes SE and DE of the display element layer EVL may be disposed on the second gate insulating layer GI2. In an embodiment, the source electrode SE may be disposed on the second gate insulating layer GI2 to be electrically connected to the source area of the semiconductor layer ACT through a contact hole defined through the second gate insulating layer GI2 and the first gate insulating layer GI1, and the drain electrode DE may be disposed on the second gate insulating layer GI2 to be electrically connected to the drain area of the semiconductor layer ACT through a contact hole defined through the second gate insulating layer GI2 and the first gate insulating layer GI1.

The source/drain electrodes SE and DE may include a metal. In an embodiment, for example, the source/drain electrodes SE and DE may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In some embodiments, the source/drain electrodes SE and DE may have a multilayer structure. In an embodiment, for example, the source/drain electrodes SE and DE may have a two-layer structure of Ti/Al or a three-layer structure of Ti/Al/Ti.

The first via insulating layer VIA1 of the display element layer EVL may be a planarization layer. The first via insulating layer VIA1 may be disposed on the second gate insulating layer GI2 in which the source/drain electrodes SE and DE are disposed. In some embodiments, the first via insulating layer VIA1 may be formed using an organic insulating material such as an acrylic-based resin, a polyimide-based resin, or a polyamide-based resin.

The connection electrode CNE of the display element layer EVL may be disposed on the first via insulating layer VIA1. The connection electrode CNE may serve to electrically connect the drain electrode DE and the light emitting element. in an embodiment, the connection electrode CNE may be electrically connected to the drain electrode DE through a contact hole defined through the first via insulating layer VIA1.

The connection electrode CNE may include a metal. In an embodiment, for example, the connection electrode CNE may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In some embodiments, the connection electrode CNE may have a multilayer structure. In an embodiment, for example, the connection electrode CNE may have a two-layer structure of Ti/Al or a three-layer structure of Ti/Al/Ti.

The second via insulating layer VIA2 of the display element layer EVL may be disposed on the first via insulating layer VIA1 on which the connection electrode CNE is formed. The second via insulating layer VIA2 may be a planarization layer. Similarly to the first via insulating layer VIA1, the second via insulating layer VIA2 may be formed using an organic insulating material such as an acrylic-based resin, a polyimide-based resin, or a polyamide-based resin.

The light emitting element of the display element layer EVL may be disposed on the second via insulating layer VIA2. The light emitting element may include an anode electrode ANO, an emission layer EML, and a cathode electrode CAT.

The anode electrode ANO of the light emitting element may be electrically connected to the connection electrode CNE through a contact hole defined through the second via insulating layer VIA2 to be electrically connected to the drain electrode DE. The anode electrode ANO may include a metal.

The pixel defining layer PDL may be disposed on the second via insulating layer VIA2 on which the anode electrode ANO is disposed. The pixel defining layer PDL may be formed using an organic material or the like. The pixel defining layer PDL may defined an opening partially exposing the anode electrode ANO.

The emission layer EML of the light emitting element may be disposed on the anode electrode ANO and the pixel defining layer PDL. In an embodiment where the emission layer EML is an organic emission layer including an organic material, the light emitting element may be an organic light emitting diode. In an embodiment, where the emission layer EML includes a quantum dot emission layer EML, the light emitting element may be a quantum dot light emitting element. In an embodiment, where the emission layer EML includes an inorganic semiconductor, the light emitting element may be an inorganic light emitting element. Alternatively, the light emitting element may be a miniature light emitting diode.

The cathode electrode CAT of the light emitting element may be disposed on the emission layer EML. The cathode electrode CAT may be disposed to have substantially the same thickness along profiles of the emission layer EML and the pixel defining layer PDL. The cathode electrode CAT may include a metal.

The capping layer CPL of the display element layer EVL may serve to protect the cathode electrode CAT. The capping layer CPL may be disposed on the cathode electrode CAT to have substantially a constant thickness along a profile of the cathode electrode CAT. The capping layer CPL may include an organic insulating material.

The second substrate 300 may be disposed on the display element layer EVL. The second substrate 300 may be an encapsulation substrate that protects the display element layer EVL. The second substrate 300 may be spaced apart from the first substrate 100 to face the first substrate 100. In an embodiment, the second substrate 300 may be spaced apart from the top surface of the first substrate 100 to face each other in the third direction DR3. In such an embodiment, the other side surface (hereinafter, referred to as a 'bottom surface') of the second substrate 300 in the third direction DR3 may face the top surface of the first substrate 100. In an embodiment, the second substrate 300 may be spaced apart from the display element layer EVL in the third direction DR3. In an embodiment, the second substrate 300 may be disposed to be spaced apart from the capping layer CPL disposed on the uppermost portion of the display element layer EVL.

The bottom surface of the second substrate 300 may include a surface modification area HPA whose surface is modified to have hydrophobicity. Herein, "having hydrophobicity" means that a surface contact angle, which is an angle between a surface of a target material and a tangent line corresponding to a portion of water ($H_2O$) in a liquid state that touches the surface of the target material, is about 90° or greater when the water ($H_2O$) in the liquid state is mechanically balanced on the surface of the target material. The surface modification area HPA of the second substrate 300 is a portion of the bottom surface of the second substrate 300 and may face the top surface of the first substrate 100 in the third direction DR3.

In some embodiments, the surface modification area HPA of the second substrate 300 may be a bottom surface of the second substrate 300 surface-modified with fluorine atoms as illustrated in FIG. 5. Herein, "the bottom surface is surface-modified with fluorine atoms" means that atoms disposed on the bottom surface of the second substrate 300 and fluorine atoms form a covalent bond, so that the bottom surface of the second substrate 300 is coated with fluorine atoms. This may be a result of fluorine plasma treatment on the bottom surface of the second substrate 300 in a method of manufacturing the display device 1 to be described later. In an embodiment, when the bottom surface of the second substrate 300 is treated with fluorine plasma and the surface is surface-modified with fluorine atoms, the fluorine plasma-treated area has hydrophobicity. Therefore, in such an embodiment, the fluorine plasma-treated area may define the surface modification area HPA of the second substrate 300 having hydrophobicity.

The surface modification area HPA of the second substrate 300 may serve to control the degree of spreading of the filling member 500 in a method of manufacturing the display device to be described later. A detailed description thereof will be provided below.

In an embodiment, the display area DA and the non-display area NDA of the display device 1 may also be applied to the first substrate 100 and the second substrate 300. In such an embodiment, an area of the first substrate 100 overlapping the display element layer EVL in the third direction DR3 may be a display area DA of the first substrate 100, and an area of the first substrate 100 that does not overlap the display element layer EVL in the third direction DR3 may be a non-display area NDA of the first substrate 100. In such an embodiment, an area of the second substrate 300 overlapping the display element layer EVL in the third direction DR3 may be a display area DA of the second substrate 300, and an area of the second substrate 300 that does not overlap the display element layer EVL in the third direction DR3 may be a non-display area NDA of the second substrate 300.

A frit member 700 surrounding or overlapping edge portions of the first substrate 100 and the second substrate 300 may be disposed on the first substrate 100 and the second substrate 300. The frit member 700 may serve to bond the edge portions of the first substrate 100 and the second substrate 300 to each other. In an embodiment, the frit member 700 may be disposed on both end portions of the first substrate 100 in the first direction DR1 and both end portions of the second substrate 300 in the first direction DR1 with reference to FIG. 2 to connect both end portions of the first substrate 100 and the second substrate 300 in the first direction DR1, respectively, to each other. Accordingly, the first substrate 100 and the second substrate 300 may be spaced apart from each other in the third direction DR3 in the display area DA, and may be connected to each other by the frit member 700 at both end portions of the non-display area NDA in the first direction DR1.

The frit member 700 may not overlap the display area DA and may overlap the non-display area NDA. In an embodiment, the frit member 700 may be spaced apart from the display element layer EVL in both sides in the first direction DR1 as shown in FIG. 2. In such an embodiment, the frit member 700 may be disposed to surround an outer portion of the display element layer EVL. A width (hereinafter, referred to as "thickness") of the frit member 700 in the third direction DR3 may be greater than a width (hereinafter, referred to as "thickness") of the display element layer EVL in the third direction DR3. In an embodiment, where the thickness of the display element layer EVL is smaller than the thickness of the frit member 700, the display element layer EVL may be spaced apart from the second substrate 300 in the third direction DR3 since the first substrate 100 and the second substrate 300 may be spaced apart from each other by the thickness of the frit member 700 in the display area DA.

The frit member 700 may be melted through a laser irradiation process in a method of manufacturing the display device 1 to be described later to bond the first substrate 100 and the second substrate 300 to each other. In an embodiment, the frit member 700 may include glass.

The filling member 500 may be interposed in a space (or a separated space) between the first substrate 100 and the second substrate 300. In an embodiment, the filling member 500 may fill a space surrounded by the first substrate 100, the second substrate 300, and the frit member 700. In some embodiments, the filling member 500 may completely cover the display element layer EVL. In such embodiments, the filling member 500 may cover one side surface of the display element layer EVL in the third direction DR3 and both side surfaces of the display element layer EVL in the first direction DR1. In some embodiments, the filling member 500 may completely fill the space surrounded by the first substrate 100, the second substrate 300, and the frit member 700, but is not limited thereto.

The filling member 500 may serve to fill the space between the first substrate 100 and the second substrate 300 to enhance a mechanical strength of the display device 1 and match a refractive index according to a path of light emitted from the display element layer EVL on the first substrate 100. In a case where the filling member 500 is not interposed between the first substrate 100 and the second substrate 300 and an air layer is formed therebetween, there is a risk that screen visibility may decrease because the refractive index is changed according to the path of light emitted from the display element layer EVL and the light is scattered, and the mechanical strength may be weakened because there is no supplementary material between the first substrate 100 and the second substrate 300 except for the frit member 700 to be described later. Accordingly, in an embodiment of the invention, the space between the first substrate 100 and the second substrate 300 is filled with the filling member 500, such that the mechanical strength may be improved and the screen visibility may be improved. In some embodiments, a refractive index of the filling member 500 may be about 1.4 or greater and about 1.5 or less. If the refractive index of the filling member 500 is less than about 1.4, light emitted from the display element layer EVL may be scattered, and if the refractive index of the filling member 500 is greater than about 1.5, transmittance may be reduced.

The filling member 500 may be in direct contact with the surface modification area HPA of the second substrate 300. Accordingly, in a process of manufacturing the display device 1 to be described later, a spreading speed of the filling member 500 may be controlled. A detailed description thereof will be provided below.

In some embodiments, the filling member 500 may be in direct contact with the frit member 700, but is not limited thereto.

The filling member 500 may be in direct contact with the display element layer EVL. In an embodiment, the filling member 500 may be in direct contact with the capping layer CPL of the display element layer EVL. Accordingly, the filling member 500 may include a material that is not reactive with the display element layer EVL. In some embodiments, the filling member 500 may include an organic material including silicon (Si). In an embodiment, for example, the filling member 500 may include at least one selected from an acrylate-based resin including silicon, an epoxy-based resin including silicon, a vinyl-based resin including silicon, and a phenyl-based resin including silicon, but is not limited thereto. In an embodiment, the filling member 500 includes silicon such that the spreading in a method of manufacturing the display device 1 to be described later may be effectively controlled, because reactivity between the display element layer EVL and the filling member 500 is low and the filling member 500 has a relatively low degree of hydrophobicity (or a lower hydrophobicity) than that of the surface modification area HPA of the second substrate 300.

Herein, "having a relatively low degree of hydrophobicity" or "having lower hydrophobicity" may mean that a surface contact angle, which is an angle between a surface of a target material and a tangent line corresponding to a portion of water ($H_2O$) in a liquid state that touches the surface of the target material, is relatively small when the water ($H_2O$) in the liquid state is mechanically balanced on the surface of the target material, and "having a relatively high degree of hydrophobicity" or "having higher hydrophobicity" may mean that a surface contact angle, which is an angle between a surface of a target material and a tangent line corresponding to a portion of water ($H_2O$) in a liquid state that touches the surface of the target material, is relatively large. In an embodiment, for example, the degree of hydrophobicity of a filler is relatively lower than that of the surface modification area HPA of the second substrate 300, a surface contact angle between the surface modification area HP A of the second substrate 300 and the water in the liquid state is greater than a surface contact angle between the filling member 500 and the water in the liquid state, i.e., the surface contact angle between the filling member 500 and the water in the liquid state is smaller than the surface contact angle between the surface modification area HPA of the second substrate 300 and the water in the liquid state. In some embodiments, the filling member 500 may have hydrophilicity, but is not limited thereto. Herein, "having hydrophilicity" means that a surface contact angle, which is an angle between a surface of a target material and a tangent line corresponding to a portion of water ($H_2O$) in a liquid state that touches the surface of the target material, is less than 90° when the water ($H_2O$) in the liquid state is mechanically balanced on the surface of the target material.

In an embodiment, the filling member 500 may further include a platinum (Pt) catalyst. The platinum catalyst may serve as an initiator for the filling member 500 to be cured in a process of manufacturing the display device 1 to be described later. In some embodiments, the content of the platinum catalyst in the filling member 500 may be about 0.1% or greater and about 3% or less. If the content of the platinum catalyst in the filling member 500 is less than about 0.1%, the curing of the filling member 500 may not occur. If the content of the platinum catalyst in the filling member 500 is greater than about 3%, the transmittance of light emitted from the display element layer EVL may be reduced.

As described above, in embodiments of the display device 1, the screen visibility and the mechanical strength may be improved without affecting the display element layer EVL. Hereinafter, a method of manufacturing the display device 1 according to an embodiment will be described.

FIGS. 6 to 20 are views for describing a method of manufacturing the display device 1 according to an embodiment.

Referring to FIG. 6, an embodiment of a method of manufacturing the display device 1 may include disposing (e.g., providing or forming) a display element layer EVL on a top surface of a mother glass MG and forming a cell area thereon (S100), forming a surface modification area HPA by performing a fluorine plasma treatment on a top surface of a mother encapsulation glass MEG (S200), forming an outer sealing member SM and a frit member 700 surrounding the surface modification area HPA on the top surface of the mother encapsulation glass MEG (S300), applying a filling material 500' to the surface modification area HPA of the mother encapsulation glass MEG (S400), bonding the mother encapsulation glass MEG applied with the filling material 500' and the mother glass MG on which the cell area is formed to each other (S500), forming a filling member 500 by curing the filling material 500' after the filling material 500' spreads and comes into contact with the frit member 700 (S600), and obtaining a cell by cutting the mother glass MG and the mother encapsulation glass MEG bonded to each other (S700). Hereinafter, the processes of an embodiment of a method of manufacturing the display device will be described in detail with reference to FIGS. 7 to 20.

Referring to FIGS. 7 and 8, in an embodiment of the method of manufacturing a display device, a mother glass MG is prepared, and then, a display element layer EVL is disposed or provided on a top surface of the mother glass MG to form a cell area. In an embodiment, for example, a process of disposing the display element layer EVL may be performed by a deposition process.

The mother glass MG is a substrate including a same material as the first substrate 100, and may be a substrate in which a plurality of cell areas are formed to obtain a plurality of display devices 1 at once. Each cell area may be an area corresponding to one display device 1. The cell area defined on the mother glass MG is referred to as a first cell area CA1 for convenience. One area corresponding to the first cell area CAL of the mother glass MG may become the first substrate 100 through a cutting process, which will be described later. In some embodiments, the first cell area CA1 may be arranged in a grid pattern on the mother glass MG.

A plurality of display elements may be arranged in a grid pattern on the mother glass MG. The display element layer EVL may be disposed in a plurality of first cell areas CA1. In such an embodiment, the display element layer EVL may be provided on the mother glass MG using a process well known in the art, and thus, a detailed description thereof will be omitted.

Next, referring to FIGS. 9 and 10, a mother encapsulation glass MEG is prepared, and a plurality of surface modification areas HPA are formed by performing fluorine plasma treatment on one surface of the mother encapsulation glass MEG. The plurality of surface modification areas HPA may be arranged in a grid pattern.

The mother encapsulation glass MEG is a substrate including a same material as the second substrate 300, and may be a substrate in which a plurality of cell areas are formed to obtain a plurality of display devices 1 at once. As described above, the cell area may be an area corresponding to one display device 1. The cell area defined on the mother encapsulation glass MEG is referred to as a second cell area CA2 for convenience. One area corresponding to the second cell area CA2 of the mother encapsulation glass MEG may become the second substrate 300 through a cutting process, which will be described later. The second cell area CA2 of the mother encapsulation glass MEG may overlap the first cell area CA1 of the mother glass MG in a process of bonding the mother encapsulation glass MEG and the mother glass MG. In some embodiments, the second cell area CA2 may be arranged in a grid pattern on the mother encapsulation glass MEG.

When the surface modification area HPA is formed by performing the fluorine plasma treatment process on one surface of the mother encapsulation glass MEG, atoms disposed on one surface of the mother encapsulation glass MEG and fluorine atoms form a covalent bond, such that the bottom surface of the mother encapsulation glass MEG may be coated with fluorine atoms, as described above with reference to FIG. 5. The degree of hydrophobicity of the surface modification area HPA may vary depending on a time for performing the fluorine plasma treatment process on one surface of the mother encapsulation glass MEG. For example, if the time of the fluorine plasma treatment process performed on one surface of the mother encapsulation glass MEG is long, the hydrophobicity of the surface modification area HPA becomes relatively large, and if the time of the fluorine plasma treatment process is short, the hydrophobicity of the surface modification area HPA becomes relatively small.

The mother encapsulation glass MEG may be turned over in a process of bonding the mother glass MG and the mother encapsulation glass MEG. Accordingly, one surface of the mother encapsulation glass MEG may correspond to the bottom surface of the second substrate 300 described above.

The surface modification area HPA may be disposed in the second cell area CA2. In addition, the surface modification area HPA may have a greater width than an area EVL' corresponding to the display element layer EVL as illustrated in FIG. 10. Accordingly, the surface modification area HPA may completely cover the display element layer EVL in the third direction DR3 in the display device 1 according to an embodiment.

Next, referring to FIG. 11, a sealing member SM surrounding an edge of the mother encapsulation glass MEG and a frit member 700 surrounding the surface modification area HPA are disposed on one surface of the mother encapsulation glass MEG on which the surface modification area HPA is formed. A process of disposing the sealing member SM and the frit member 700 may be performed by, for example, a thermal bonding method using a laser.

The sealing member SM may serve to connect edges of the mother encapsulation glass MEG and the mother glass MG. Since the sealing member SM is disposed along the edge of the mother encapsulation glass MEG, the second cell area CA2 may be disposed inside the sealing member SM.

The frit member 700 may serve to connect an edge of the first cell area CAL of the mother glass MG and an edge of the second cell area CA2 of the mother encapsulation glass MEG. The frit member 700 may be disposed to surround the surface modification area HPA. In some embodiments, the frit member 700 may be disposed to be spaced apart from the surface modification area HPA. Accordingly, the surface modification area HPA may be disposed inside the frit member 700.

Next, referring to FIG. 12, a filling material 500' is applied on the surface modification area HPA on the mother encapsulation glass MEG on which the frit member 700 is formed. In an embodiment, for example, the filling material 500' may be applied in the form of a plurality of dots through a jet dispenser on the surface modification area HP A.

When the filling material 500' is applied in a grid pattern in the form of the plurality of dots on the surface modification area HPA, the filling material 500' may be evenly spread in the subsequent bonding process of bonding the mother glass MG and the mother encapsulation glass MEG. Although the drawing illustrates that the filling material 500' is applied in the form of five dots per one row in the first direction DR1 on the surface modification area HPA, it would be understood that the number of dots in which the filling material 500' is applied is not limited thereto.

The filling material 500' may include a same material and composition as the filling member 500. In such an embodiment, the filling material 500' may include at least one selected from an acrylate-based resin including silicon, an epoxy-based resin including silicon, a vinyl-based resin including silicon, and a phenyl-based resin including silicon, as a material having low reactivity with the display element layer EVL, and have relatively lower hydrophobicity than the surface modification area HPA, and have the content of a platinum catalyst of about 0.1% or greater and about 3% or less, and a refractive index of about 1.4 or greater and about 1.5 or less. The filling material 500' may form the filling member 500 through a curing process to be described later. In such an embodiment, the filling member 500 may be a result of the filling material 500' cured.

Since the filling material 500' applied in the form of dots on the surface modification area HP A has hydrophilicity or hydrophobicity smaller than that of the surface modification area HPA, a predetermined contact angle may be maintained and spreading characteristics may be controlled on the surface modification area HP A.

Next, referring to FIGS. 13 to 17, the mother encapsulation glass MEG applied with the filling material 500' and the mother glass MG are bonded to each other. In an embodiment, for example, a process of bonding the mother glass MG and the mother encapsulation glass MEG to each other may be performed through a thermo-compression process by applying a laser to the frit member 700. FIG. 14 schematically illustrates a cross section taken along line X2-X2' illustrated in FIGS. 8 and 12, and FIG. 17 schematically illustrates a cross section taken along line X2-X2' illustrated in FIG. 16.

The process of bonding the mother encapsulation glass MEG and the mother glass MG to each other may be performed in a state where the display element layer EVL on the mother glass MG and the surface modification area HPA of the mother encapsulation glass MEG are disposed opposite to or to face each other. When the mother encapsulation glass MEG and the mother glass MG are bonded to each other, the filling material 500' applied on the mother encapsulation glass MEG may spread due to a thickness of the display element layer EVL itself formed on the mother glass MG as illustrated in FIG. 15.

In such an embodiment, as described above, since the filling material 500' has relatively lower hydrophobicity than that of the surface modification area HPA, the contact angle tends to be maintained, such that the spreading may be effectively controlled. In such an embodiment, as illustrated in FIGS. 15 and 16, the filling material 500' may maintain a state spaced apart from the frit member 700 for a predetermined period of time without being in contact with the frit member 700 by being spread completely immediately in a space surrounded by the mother encapsulation glass MEG, the mother glass MG, and the frit member 700.

In the state in which the filling material 500' is spaced apart from the frit member 700 without being in contact with the frit member 700 by being spread completely immediately in the space surrounded by the mother encapsulation glass MEG, the mother glass MG, and the frit member 700, the frit member 700 may be irradiated with a laser beam L to partially melt the frit member 700 to bond the mother glass MG and the mother encapsulation glass MEG to each other. Since the filling material 500' has not reached the frit member 700 and has not come into contact with the frit member 700 when the frit member 700 is irradiated with the laser beam L, the filling material 500' may not be affected by thermal energy by the laser beam L radiated to the frit member 700 or thermal energy by the frit member 700 itself.

If the filling material 500' reaches and comes into contact with the frit member 700 when the frit member 700 is irradiated with the laser beam L, the filling material 500' may be affected by thermal energy by the laser beam L radiated to the frit member 700 or thermal energy by the frit member 700 itself, and gas may be emitted from the filling material 500', which may damage the display element layer EVL.

In an embodiment of the invention, as described above, by controlling the spreading characteristics of the filling material 500' applied on the surface modification area HPA after forming the surface modification area HPA by performing fluorine plasma treatment on one surface of the mother encapsulation glass MEG, the filling material 500' may be effectively prevented from reaching and contacting the frit member 700 when the frit member 700 is irradiated with the laser beam L.

Next, referring to FIGS. 18 to 20, after the filling material 500' is completely spread in the space surrounded by the mother encapsulation glass MEG, the mother glass MG, and the frit member 700, the filling material 500' is cured to form the filling member 500, and the cell area is cut to obtain the display device 1 of FIG. 2. In an embodiment, for example, a process of curing the filling material 500' may be performed by performing thermal curing, ultraviolet (UV) curing, or thermal curing and UV curing at the same time.

In an embodiment, the filling material 500' may completely spread in the space surrounded by the mother encapsulation glass MEG, the mother glass MG, and the frit member 700 to be in contact with the frit member 700 and completely cover the display element layer EVL. Accordingly, in an embodiment of the display device 1, the mechanism stability and screen visibility may be improved.

Hereinafter, alternative embodiments of the display device 1 will be described. In the following embodiments, the same components as those of the above-described embodiment will be denoted by the same reference numerals, and any repetitive detailed description thereof will be omitted or simplified and differences will be mainly described.

FIG. 21 is a structural view schematically illustrating a structure of a display device according to an alternative embodiment.

Referring to FIG. 21, in an embodiment of a display device 1_1, a surface modification area HPA1 of a second substrate 301 may be in contact with the frit member 700. In such an embodiment, the frit member 700 may partially overlap the surface modification area HPA1 of the second substrate 301.

In such an embodiment, the spreading characteristics of the filling material 500' may be more effectively controlled.

FIG. 22 is a structural view schematically illustrating a structure of a display device according to another alternative embodiment.

Referring to FIG. 22, in an embodiment of a display device 1_2, a filling member 502 may be spaced apart from the frit member 700. In such an embodiment, the filling member 502 may completely surround the display element layer EVL, but may not come into contact with the frit member 700.

In such an embodiment, the filling member 502 completely surrounds the display element layer EVL, such that the filling member 502 may be interposed beyond the display area DA to the non-display area NDA. A space between the filling member 502 and the frit member 700 may overlap the non-display area NDA. In such an embodiment, the filling material 500' may not completely fill the space surrounded by the mother encapsulation glass MEG, the mother glass MG, and the frit member 700 by applying a small amount of the filling material 500'.

In such an embodiment, the transfer of thermal energy by the laser to the filling material 500' may be effectively prevented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

The invention claimed is:

1. A display device comprising:
a first substrate including a first surface, on which a display area and a non-display area are defined;
a second substrate disposed to face and be spaced apart from the first surface of the first substrate;
a display element layer disposed on the first surface of the first substrate in the display area to be spaced apart from the second substrate;
a filling member interposed in a space between the first substrate and the second substrate; and
a frit member which connects edge portions of the first substrate and the second substrate to each other,
wherein the second substrate includes a second surface facing the first surface of the first substrate,
a surface modification area is defined on the second surface of the second substrate only in an area inside a boundary between the filling member and the frit member in a plan view,
a portion of the filling member in the display area is in direct contact with the surface modification area of the second substrate, and
the surface modification area has hydrophobicity higher than hydrophobicity of the filling member.

2. The display device of claim 1,
wherein the surface modification area completely covers the display element layer.

3. The display device of claim 2,
wherein the surface modification area of the second surface is defined by an area of the second surface which is surface-modified with fluorine atoms.

4. The display device of claim 3,
wherein the first substrate and the second substrate include glass.

5. The display device of claim 1,
wherein the filling member is in direct contact with the display element layer and the surface modification area of the second substrate.

6. The display device of claim 5,
wherein the filling member includes at least one selected from an acrylate-based resin including silicon, an epoxy-based resin including silicon, a vinyl-based resin including silicon, and a phenyl-based resin including silicon.

7. The display device of claim 6,
wherein the filling member has a refractive index of about 1.4 or greater and about 1.5 or less.

8. The display device of claim 7,
wherein the filling member includes a platinum catalyst, and
the content of the platinum catalyst in the filling member is about 0.1% or greater and about 0.3% or less.

9. The display device of claim 1,
wherein the frit member surrounds the surface modification area and does not overlap the surface modification area.

10. The display device of claim 9,
wherein the frit member is disposed to be spaced apart from the display element layer, and
the filling member completely covers the display element layer.

11. The display device of claim 10,
wherein the filling member is in direct contact with the frit member.

12. The display device of claim 11,
wherein the filling member completely fills the space between the first substrate and the second substrate.

13. A method of manufacturing a display device, the method comprising:
preparing a first substrate on which a display area and a non-display area are defined, wherein a display element layer is disposed on one surface of the first substrate in the display area;
preparing a second substrate;
forming a surface modification area by performing hydrophobic treatment on one surface of the second substrate;
disposing a frit member surrounding the surface modification area on the one surface of the second substrate;
applying a filling member on the surface modification area of the second substrate after the disposing the frit member, wherein the surface modification area of the second surface of the second substrate is defined only in an area inside a boundary between the filling member and the frit member in a plan view, and a portion of the filling member in the display area is in direct contact with the surface modification area of the second substrate; and bonding the first substrate and the second substrate to each other in a way such that the one surface of the first substrate and the one surface of the second substrate face each other.

14. The method of claim 13,
wherein the forming the surface modification area by performing the hydrophobic treatment on the one surface of the second substrate comprises performing the hydrophobic treatment by a fluorine plasma treatment process.

15. The method of claim 14,
wherein the filling member has hydrophobicity lower than hydrophobicity of the surface modification area.

16. The method of claim 13,
wherein the applying the filling member on the surface modification area of the second substrate comprises applying the filling member in the form of a dot.

17. The method of claim 16,
wherein the filling member is not in contact with the frit member when the filling member is applied on the surface modification area of the second substrate.

18. The method of claim 13,
further comprising, after the bonding of the first substrate and the second substrate to each other, irradiating the frit member with a laser beam.

19. The method of claim 18,
further comprising, after the irradiating the frit member with the laser beam, spreading the filling member to be in contact with the frit member.

20. The method of claim 19,
further comprising, after the spreading the filling member to be in contact with the frit member, curing the filling member.

21. An electronic device comprising:
a first substrate including a first surface, on which a display area and a non-display area are defined;
a second substrate disposed to face and be spaced apart from the first surface of the first substrate;
a display element layer disposed on the first surface of the first substrate in the display area to be spaced apart from the second substrate;
a filling member interposed in a space between the first substrate and the second substrate; and
a frit member which connects edge portions of the first substrate and the second substrate to each other,
wherein the second substrate includes a second surface facing the first surface of the first substrate,
a surface modification area is defined on the second surface of the second substrate only in an area inside a boundary between the filling member and the frit member in a plan view,
a portion of the filling member in the display area is in direct contact with the surface modification area of the second substrate, and
the surface modification area has hydrophobicity higher than hydrophobicity of the filling member.

* * * * *